(12) United States Patent
Ahn et al.

(10) Patent No.: US 12,373,004 B2
(45) Date of Patent: Jul. 29, 2025

(54) DISPLAY DEVICE

(71) Applicant: Samsung Display Co., Ltd., Yongin-Si (KR)

(72) Inventors: Seong Sik Ahn, Yongin-si (KR); Min Ki Kim, Hwaseong-si (KR); Ah-Ram Lee, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/588,506

(22) Filed: Feb. 27, 2024

(65) Prior Publication Data

US 2024/0206080 A1 Jun. 20, 2024

Related U.S. Application Data

(63) Continuation of application No. 18/078,666, filed on Dec. 9, 2022, now Pat. No. 11,968,789, which is a (Continued)

(30) Foreign Application Priority Data

Nov. 27, 2018 (KR) .................. 10-2018-0148256

(51) Int. Cl.
H05K 5/00 (2025.01)
(52) U.S. Cl.
CPC ................................ H05K 5/0017 (2013.01)
(58) Field of Classification Search
CPC ..................................................... H05K 7/00
See application file for complete search history.

(56) References Cited

U.S. PATENT DOCUMENTS 8,736,162 B2  5/2014 Jin et al.
9,448,592 B2  9/2016 Jin et al.
(Continued)

FOREIGN PATENT DOCUMENTS

CN  106560778     4/2017
CN  108140346 A   6/2018
(Continued)

OTHER PUBLICATIONS

Extended European Search Report dated Mar. 26, 2020, issued to European Patent Application No. 19211836.
(Continued)

*Primary Examiner* — Jerry Wu
(74) *Attorney, Agent, or Firm* — CANTOR COLBURN LLP

(57) ABSTRACT

A display device includes a front display area (FDA), side display areas (SDAs), and a corner display area (CDA). The SDAs and the CDA are disposed outside of the FDA. The SDAs include: a first SDA disposed at a first side of the FDA; and a second SDA disposed at a second side of the FDA. The CDA is disposed at a corner of the FDA between the first SDA and the second SDA. The CDA is connected to the first SDA and the second SDA. The FDA has a flat display surface. The first SDA, the second SDA, and the CDA respectively form a bent surface. A shape of the bent surface of the CDA is different from a shape of the bent surface of the first SDA and a shape of the bent surface of the second SDA. The CDA is stretchable and/or shrinkable.

9 Claims, 23 Drawing Sheets

Related U.S. Application Data continuation of application No. 16/661,023, filed on Oct. 23, 2019, now Pat. No. 11,528,812.

(56) References Cited

U.S. PATENT DOCUMENTS

| | | | |
|---|---|---|---|
| 10,008,554 | B2 | 6/2018 | Bae et al. |
| 10,054,988 | B2 | 8/2018 | Jin et al. |
| 10,156,744 | B2 | 12/2018 | Andou et al. |
| 10,224,502 | B2 | 3/2019 | Cho et al. |
| 10,283,062 | B2 | 5/2019 | Jin et al. |
| 10,528,084 | B2 | 1/2020 | Jin et al. |
| 10,657,912 | B2 | 5/2020 | Jin et al. |
| 10,983,564 | B2 | 4/2021 | Jin et al. |
| 11,599,152 | B2 | 3/2023 | Sim et al. |
| 11,822,389 | B2 | 11/2023 | Jin et al. |
| 2017/0102872 | A1* | 4/2017 | Kim ............. H04M 1/72403 |
| 2017/0301742 | A1 | 10/2017 | Jeong et al. |
| 2018/0164850 | A1 | 6/2018 | Sim et al. |
| 2020/0012320 | A1 | 1/2020 | Zou et al. |
| 2020/0057525 | A1* | 2/2020 | Prest ...................... H04R 3/12 |

FOREIGN PATENT DOCUMENTS

| | | |
|---|---|---|
| CN | 108183980 A | 6/2018 |
| CN | 207473963 A | 6/2018 |
| CN | 108766977 | 11/2018 |
| KR | 1020130061156 | 6/2013 |
| KR | 10-1588659 | 1/2016 |
| KR | 1020170039032 | 4/2017 |
| KR | 1020170041137 | 4/2017 |
| KR | 1020170043065 | 4/2017 |
| KR | 10-2017-0046873 | 5/2017 |
| KR | 10-2017-0106552 | 9/2017 |
| KR | 10-2017-0126051 | 11/2017 |
| KR | 10-2018-0001669 | 1/2018 |
| KR | 10-2018-0041240 | 4/2018 |

OTHER PUBLICATIONS

Office Action dated Nov. 17, 2021, in European Patent Application No. 19211836.2.
Non-Final Office Action issued Feb. 4, 2021, in U.S. Appl. No. 16/661,023.
Final Office Action issued Jul. 7, 2021, in U.S. Appl. No. 16/661,023.
Advisory Action issued Sep. 24, 2021, in U.S. Appl. No. 16/661,023.
Non-Final Office Action issued Oct. 28, 2021, in U.S. Appl. No. 16/661,023.
Final Office Action issued Mar. 23, 2022, in U.S. Appl. No. 16/661,023.
Advisory Action issued May 26, 2022, in U.S. Appl. No. 16/661,023.
Notice of Allowance issued Aug. 12, 2022, in U.S. Appl. No. 16/661,023.

* cited by examiner

DISPLAY DEVICE

CROSS-REFERENCE TO RELATED APPLICATION

This application is a Continuation of U.S. patent application Ser. No. 18/078,666, filed on Dec. 9, 2022, which is a Continuation of U.S. patent application Ser. No. 16/661,023, filed Oct. 23, 2019, which claims priority from and the benefit of Korean Patent Application No. 10-2018-0148256, filed Nov. 27, 2018, which is hereby incorporated by reference for all purposes as if fully set forth herein.

BACKGROUND

Field

Embodiments generally relate to a display device, and, more particularly, to a display device including a bent part.

Discussion

A variety of electronic devices utilize liquid crystal displays (LCDs) or organic light emitting diode displays (OLEDs), such as portable phones, navigation aids, digital cameras, electronic books, portable game machines, various terminals, etc. Conventionally, such a display device is typically formed as a rectangle; however, a display device having a bent part that is rounded and a display device having a bent part also displaying an image are of interest.

The above information disclosed in this section is only for understanding the background of the inventive concepts, and, therefore, may contain information that does not form prior art.

SUMMARY

Some embodiments are capable of providing a display device including corners formed to be rounded and that can display an image on the corners.

Some embodiments are capable of facilitating manufacture of a display device including rounded corners for displaying an image, and making the shape of the rounded corners better.

Additional aspects will be set forth in the detailed description which follows, and, in part, will be apparent from the disclosure, or may be learned by practice of the inventive concepts.

According to an aspect of the invention, a display device includes a front display area, a plurality of side display areas, and a corner display area. The plurality of side display areas and the corner display area are disposed outside of the front display area. The plurality of side display areas include: a first side display area disposed at a first side of the front display area; and a second side display area disposed at a second side of the front display area. The corner display area is disposed at a corner of the front display area between the first side display area and the second side display area. The corner display area is connected to the first side display area and the second side display area. The front display area has a flat display surface. The first side display area, the second side display area, and the corner display area respectively form a bent surface. A shape of the bent surface of the corner display area is different from a shape of the bent surface of the first side display area and a shape of the bent surface of the second side display area. The corner display area is stretchable and/or shrinkable.

According to some embodiments, a display device includes a front display area, a plurality of side display areas, and a corner display area. The plurality of side display areas and the corner display area are disposed outside of the front display area. The plurality of side display areas include: a first side display area disposed at a first side of the front display area; and a second side display area disposed at a second side of the front display area. The corner display area is disposed at a corner of the front display area between the first side display area and the second side display area. The corner display area is connected to the first side display area and the second side display area. The front display area has a flat display surface. The first side display area, the second side display area, and the corner display area respectively form a bent surface. A shape of the bent surface of the corner display area is different from a shape of the bent surface of the first side display area and a shape of the bent surface of the second side display area. The first side display area includes a first edge. The corner display area includes: a second edge connected to the first edge of the first side display area in an unbent state of the corner display area; and a third edge connected to the second edge in the unbent state of the corner display area. Each of the second edge and the third edge forms a curved line. In a bent state of the corner display area in which the bent surface is formed, the third edge is bonded to the second side display area.

According to some embodiments, a display device includes a first display area, and a second display area disposed around the first display area. The first display area has a flat display surface. The second display area forms a bent surface. To form the bent surface, a force to stretch and/or shrink the second display area is smaller than a force to stretch and/or shrink the first display area.

According to various embodiments, a corner of a display device may be formed to be rounded and an image may be displayed via the rounded corner. To this end, various embodiments may enable the manufacture of the rounded corner capable of displaying the image to be more easy, and the shape of the rounded corner may be better.

According to another aspect of the invention, a display device includes: a front display area; and a plurality of side display areas; and a corner display area, wherein the plurality of side display areas and the corner display area are disposed outside of the front display area, wherein the plurality of side display areas include: a first side display area adjacent to the front display area in a first direction; and a second side display area adjacent to the front display area in a second direction generally perpendicular to the first direction, wherein the corner display area is adjacent to a corner of the front display area between the first side display area and the second side display area, the corner display area being connected to the first side display area and the second side display area, and wherein: the front display area has a flat display surface; the first side display area, the second side display area, and the corner display area respectively form a bent surface, and wherein: the front display area comprises a plurality of first display units, and the plurality of first display units respectively have a first side extending in the second direction and a second side extending in the first direction; and the first side display area comprises a plurality of second display units, and the plurality of second display units respectively have a third side extending in the second direction and a fourth side extending in the first direction; in an unbent state of each of the first side display areas, a first pitch, which is a distance between first sides of two of the first display units adjacent each other in the first direction, is greater than a second pitch, which is a distance between third sides of two of the second display units adjacent each other in the first direction, and a third pitch, which is a distance between second sides of two of the first display units adjacent each other in the second direction, is substantially the same as a fourth pitch, which is a distance between fourth sides of two of the second display units adjacent each other in the second direction; and in a bent state of each of the first side display areas, the first pitch is substantially the same as the second pitch, and the third pitch is substantially the same as the fourth pitch.

The bent surface of the corner display area may may have a shape different from that of the bent surface of the first side display area and that of the bent surface of the second side display area.

Each of the first side display area, the second side display area, and the corner display area may be stretchable and/or shrinkable.

The first side display area may include a first edge; the corner display area may include a second edge connected to the first edge; in an unbent state of the first side display area, the second side display area, and the corner display area: the second display units may have a pitch in a first direction generally perpendicular to the first edge of the first side display area smaller than a pitch of the first display units in the first direction; and the third display units may have a pitch in a second direction generally perpendicular to the second edge may smaller than a pitch of the first display units in the first direction.

In an unbent state of the first side display area, the second side display area, and the corner display area: the pitch of the second display units in the first direction may be gradually reduced toward the first edge; and the pitch of the third display units in the second direction may be gradually reduced toward the second edge.

A radius of curvature of the first side display area and a radius of curvature of the corner display area may be referred to as r; and in an unbent state of the first side display area, the second side display area, and the corner display area: a distance from the first edge to a boundary between the first side display area and the front display area may be r; and a length of the second edge may be πr/2.

The first side display area may include a first edge; the corner display area may include a second edge connected to the first edge; a radius of curvature of the first side display area and a radius of curvature of the corner display area may be referred to as r; an arc length along the bent surface of the first side display area from the first edge of the first side display area to a boundary between the first side display area and the front display area may be πr/2; and an arc length of the second edge may be πr/2.

The first side display area and the second side display area may have a smaller stretching force and/or shrinking force than the corner display area, and may have substantially the same stretching force and/or a shrinking force as the front display area.

The corner display area may include a first edge in an unbent state and a second edge in a bent state in which the bent surface may be formed; a radius of curvature of the corner display area may be r; a distance from a boundary between the corner display area and the front display area to the first edge may be r; a distance on the bent surface from the boundary to the second edge in the bent state of the corner display area may be πr/2; and a length of the second edge may be πr/2 in the bent state of the corner display area.

The corner display area may include a first edge in an unbent state and a second edge in a bent state in which the bent surface may be formed; a curvature radius of the corner display area may be r; a distance from a boundary between the corner display area and the front display area to the first edge may be πr/2; and in the bent state of the corner display area: a distance on the bent surface from the boundary to the second edge may be πr/2; a length of the second edge may be πr/2; and a length of the first edge may be (π/2)2r.

In the bent state of the corner display area, at least a portion of the corner display area may be shrunk.

The first side display area may include a first edge; the corner display area may include: a second edge connected to the first edge of the first side display area in an unbent state of the corner display area; and a third edge connected to the second edge in the unbent state of the corner display area; each of the second edge and the third edge may form a curved line; and the third edge may be bonded to the second side display area in a bent state of the corner display area in which the bent surface may be formed.

A radius of curvature of the corner display area may be r; and a length of the second edge may be πr/2.

The first side display area may include a first edge; the corner display area may include: a second edge connected to the first edge of the first side display area; and a third edge connected to the second edge in an unbent state of the corner display area; the second edge may form a curved line; the third edge may form a straight line; the third edge may be stretched in a bent state of the corner display area in which the bent surface may be formed such that the straight line may be stretched to form a curved line; and the third edge forming the curved lined may be bonded to the second side display area.

A radius of curvature of the corner display area may be r; and a length of the second edge may be πr/2.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts.

DETAILED DESCRIPTION OF THE ILLUSTRATED EMBODIMENTS

Figure 1:
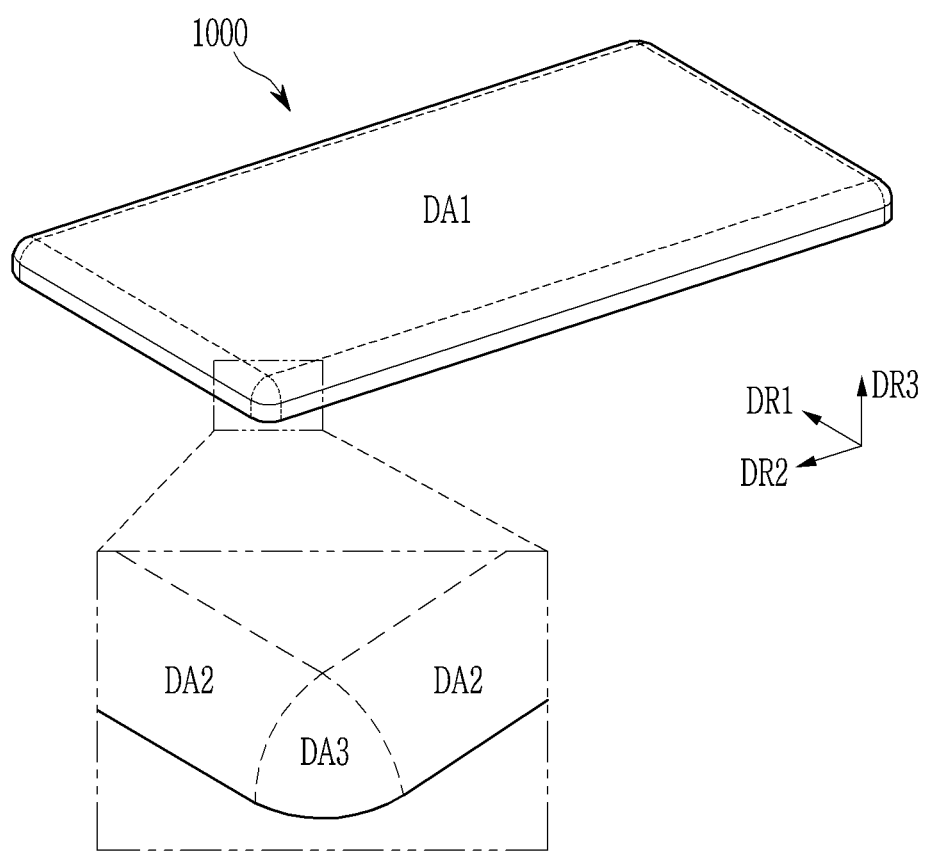
FIG. 1 is a schematic perspective view of a display device according to some embodiments.

In the following description, for the purposes of explanation, numerous specific details are set forth in order to provide a thorough understanding of various embodiments. As used herein, the terms "embodiments" and "implementations" are used interchangeably and are non-limiting examples employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection.

For the purposes of this disclosure, a plan view means a view when observing a surface parallel to two directions (e.g., a direction DR1 and a direction DR2) crossing each other, and a cross-sectional view means a view when observing a surface cut in a direction (e.g., a direction DR3) perpendicular to the surface parallel to the direction DR1 and the direction DR2. Also, to overlap two constituent elements means that two constituent elements are overlapped in the direction DR3 (e.g., a direction perpendicular to an upper surface of the substrate), unless stated otherwise. Additionally, for the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional views, isometric views, perspective views, plan views, and/or exploded illustrations that are schematic illustrations of idealized embodiments and/or intermediate structures. As such, variations from the shapes of the illustrations as a result of, for example, manufacturing techniques and/or tolerances, are to be expected. Thus, embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the inventive concepts. Further, the blocks, units, and/or modules of some embodiments may be physically combined into more complex blocks, units, and/or modules without departing from the inventive concepts.

Hereinafter, various embodiments will be explained in detail with reference to the accompanying drawings.

A display device according to some embodiments will now be described with reference to FIGS. 1 to 7.

Figure 2:
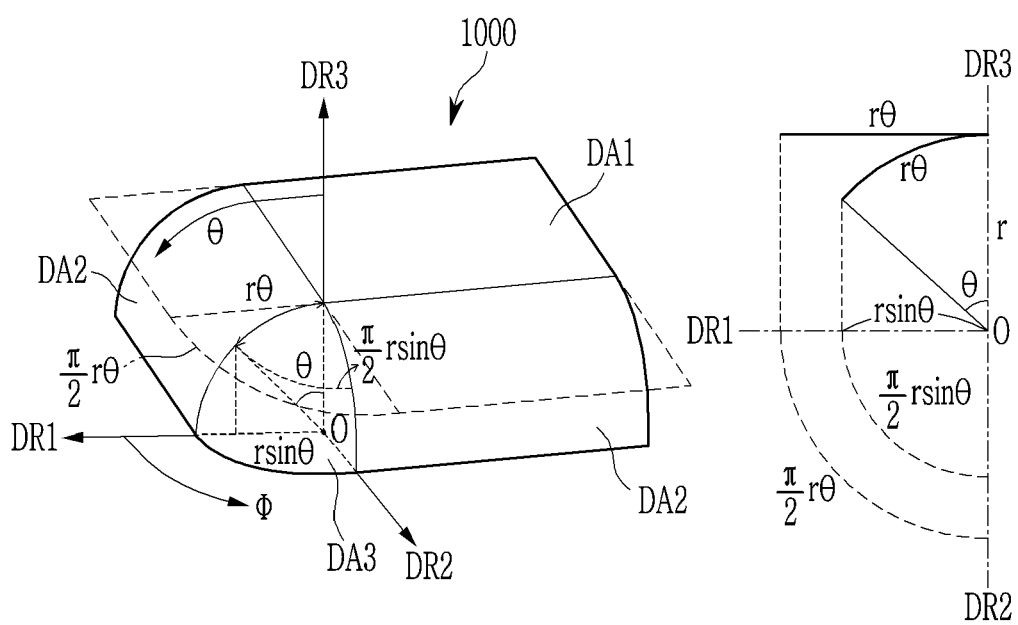
FIG. 2 is a view depicting a shape of a round corner of a display device according to some embodiments.
Figure 3:
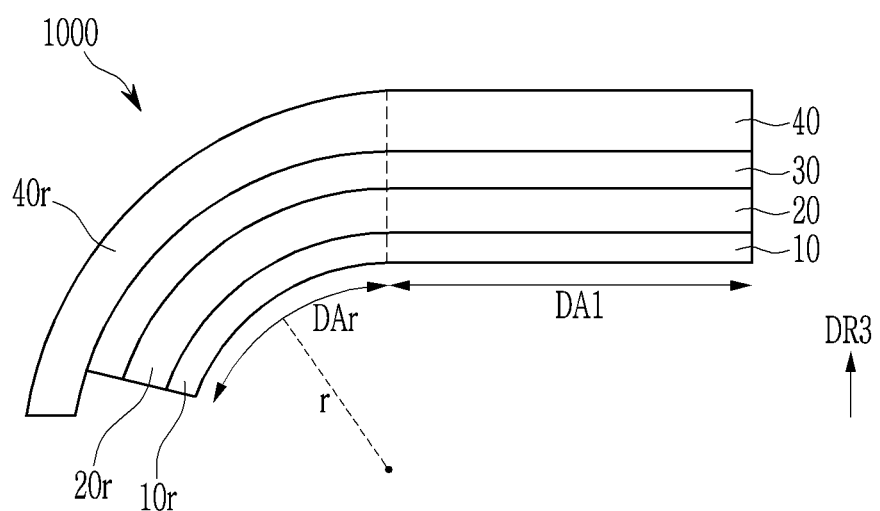
FIG. 3 is a schematic cross-sectional view of a display device according to some embodiments.
Figure 4:
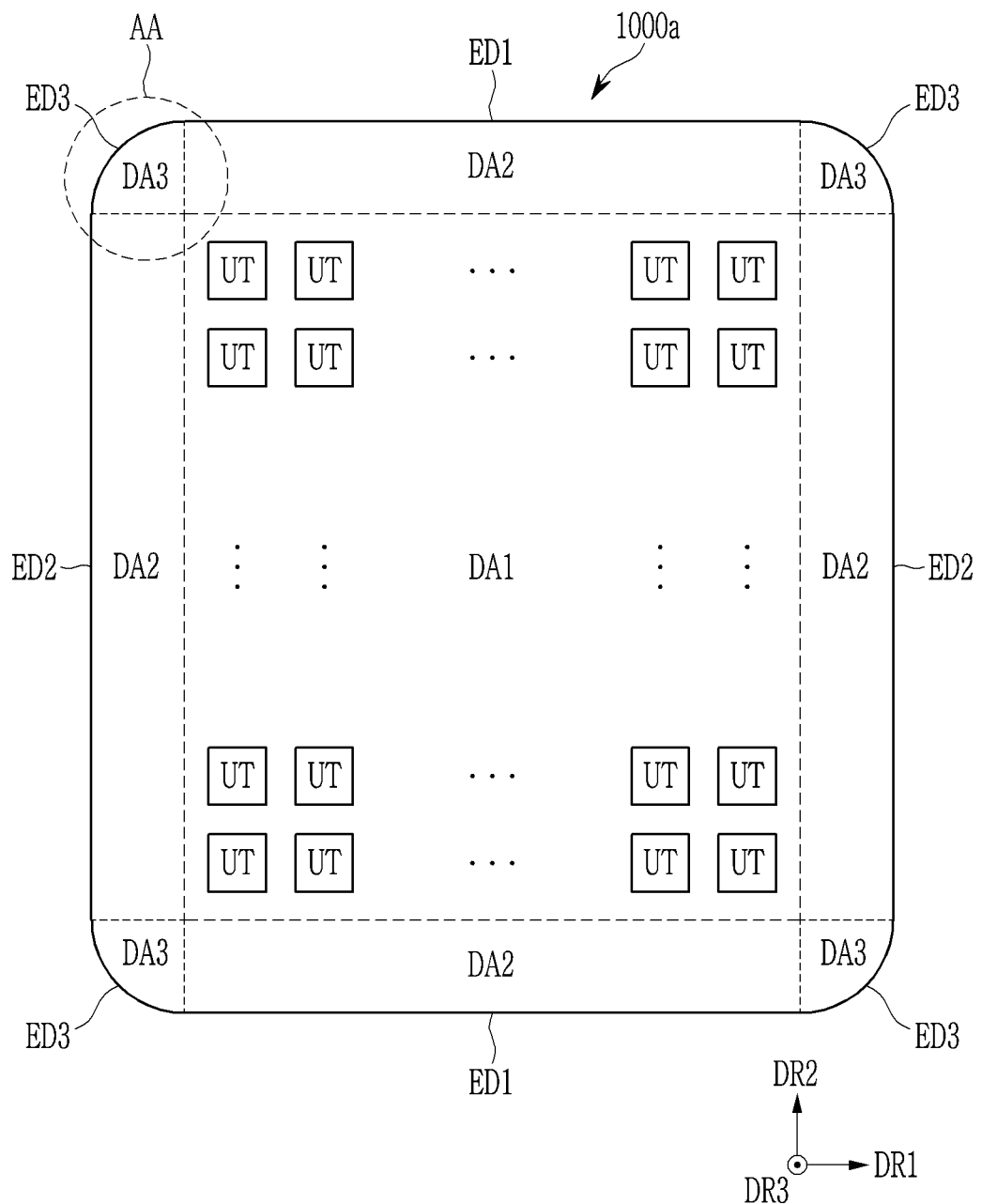
FIG. 4 is a plan layout view of a display device according to some embodiments.
Figure 5:
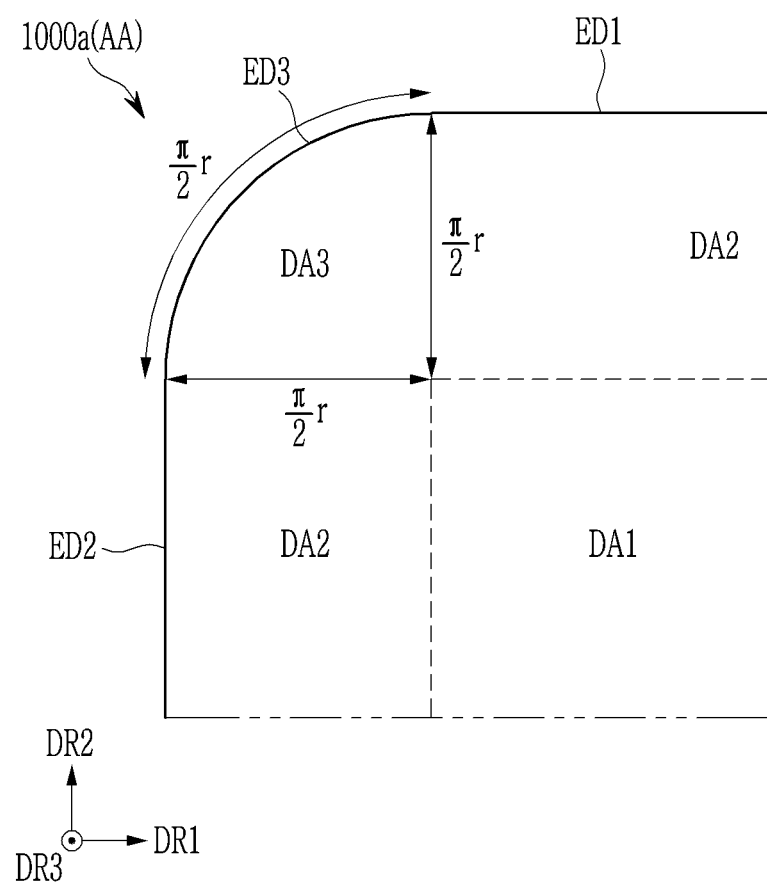
FIG. 5 is an enlarged view of a part of the display device shown in FIG. 4 according to some embodiments.
Figure 6:
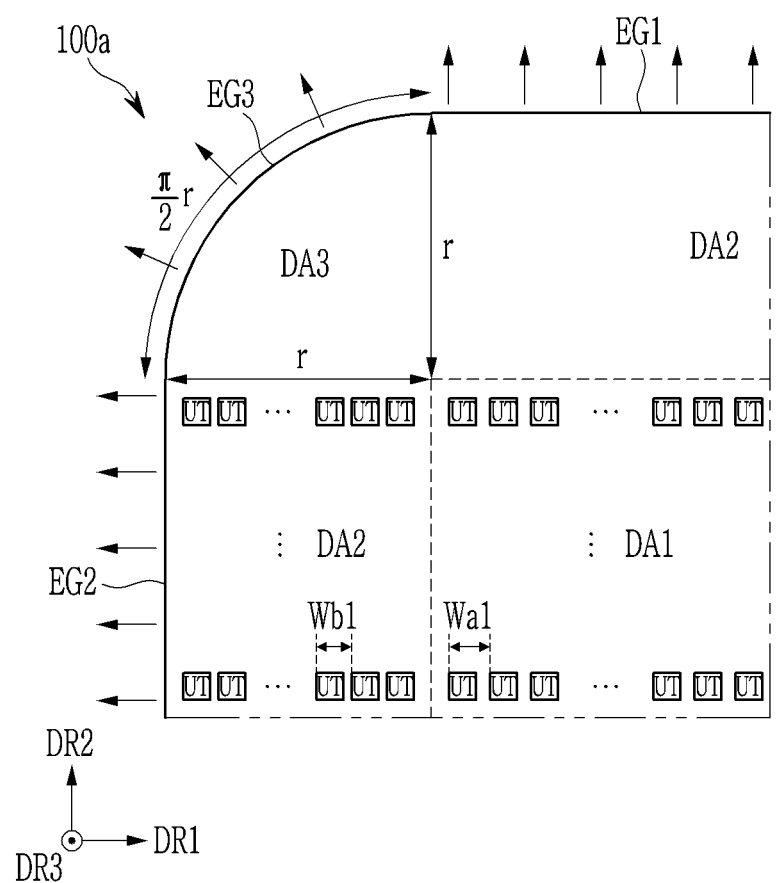
FIG. 6 is a plan exploded view of a corner before bending an edge region of the display device shown in FIG. 4 according to some embodiments.
Figure 7:
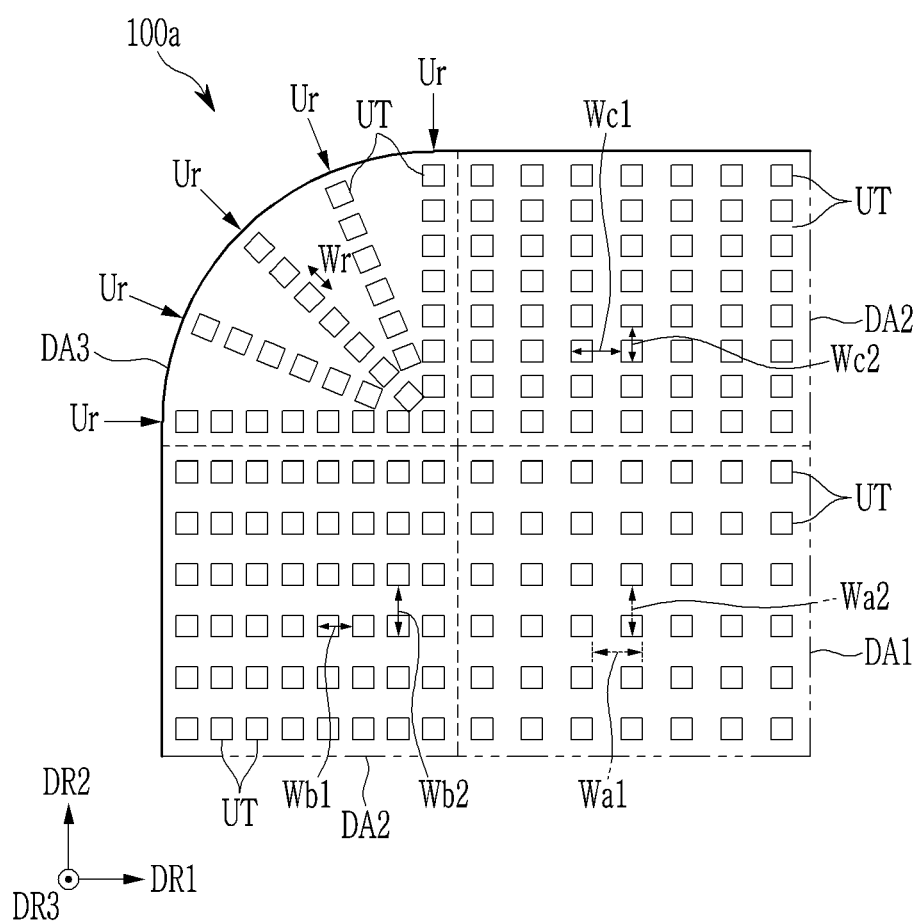
FIGS. 7 and 8 are plan exploded views of a corner including an arrangement of display units before bending an edge region of a display device according to various embodiments.

FIG. 1 is a schematic perspective view of a display device according to some embodiments. FIG. 2 is a view depicting a shape of a round corner of a display device according to some embodiments. FIG. 3 is a schematic cross-sectional view of a display device according to some embodiments. FIG. 4 is a plan layout view of a display device according to some embodiments. FIG. 5 is an enlarged view of a part of the display device shown in FIG. 4 according to some embodiments. FIG. 6 is a plan exploded view of a corner before bending an edge region of the display device shown in FIG. 4 according to some embodiments. FIG. 7 is a plan exploded view of a corner including an arrangement of display units before bending an edge region of a display device according to some embodiments.

Referring to FIG. 1, a display device 1000 according to some embodiments includes a display area for displaying an image, and the display area includes a display surface. The display area, when viewing in a third direction DR3, includes a front display area DA1 disposed on a front surface, a side display area DA2 respectively disposed on at least two sides of the front display area DA1, and a corner display area DA3 disposed in the corner of the front display area DA1. The front display area DA1 is disposed at the center or central area of the display device 1000, and the side display area DA2 and the corner display area DA3 are disposed at the edge region of the display device 1000. In this manner, the side display area DA2 and the corner display area DA3 are disposed around the front display area DA1.

The front display area DA1 may occupy the widest area in the entire display area, and may have a substantially flat display surface. The overall shape of the front display area DA1 in a plan view may be a rectangle having four sides, but is not limited thereto. The corners of the front display area DA1 may be sharp as shown or round. The four sides of the front display area DA1 may be extended to be parallel to the first direction DR1 or the second direction DR2, respectively.

The side display area DA2 may include four regions respectively connected to four sides of the top, bottom, left, and right sides of the front display area DA1, but may include only some of them. The display surface of each side display area DA2 may form the bent surface, and a curvature may be constant or different depending on positions of the bent surface. Each side display area DA2 may have a shape that is substantially similar to a part (e.g., one fourth (¼)) of the side surface of a curved column, such as an elliptical or circular cylinder.

The corner display area DA3 may be formed on four corners or some corners of the display device 1000, and may be disposed between two adjacent side display areas DA2. The display surface of each corner display area DA3 forms the bent surface, and the curvature may be constant or different depending on positions of the bent surface. The shape of the bent surface of the corner display area DA3 may be different from the shape of the bent surface of the side display area DA2. For example, each corner display area DA3 may have a shape that is similar to a part (e.g., one eighth (⅛)) of a curved body, such as a substantially spherical or elliptical sphere.

Referring to FIG. 2, the position on the display surface (also referred to as the bent surface) of the corner display area DA3 may be represented by a polar coordinate system with a curvature radius r based on an origin O shown, an angle θ (referred to as a poloidal angle with a unit of a radian, which is the angle formed by the third direction DR3), and an angle @ (referred to as an azimuth angle with a unit of a radian) of a projection onto the xy plane, which is a plane formed by the first direction DR1 and the second direction DR2, formed by the first direction DR1. Here, the curvature radius r may be constant or may vary depending on the position on the bent surface or display surface of the corner display area DA3.

Referring to FIG. 3, the display device 1000 according to some embodiments may include a display panel 10, a polarization layer 20, an adhesive layer 30, and a cover window 40, which are sequentially stacked in a cross-sectional view.

The display panel 10 may include an electrical device, such as a plurality of pixels, each of which is a unit capable of displaying the image, and a plurality of signal lines, and may include a flexible substrate. Each pixel may include at least one transistor.

The display panel 10 may further include a touch sensor layer capable of sensing an external touch. The touch sensor layer may include a plurality of touch electrodes. It is also contemplated that a separate touch sensor layer may be, additionally or alternatively, disposed between the display panel 10 and the polarization layer 20.

The polarization layer 20 may be in a form of a flexible film, and may prevent (or at least reduce) external light reflected from various electrodes or wiring included in the display panel 10 from being visible. The polarization layer 20 may be a circular polarizer, in which case the polarization layer 20 may include a linear polarizer and a quarter-wavelength plate.

The cover window 40 may be made of an insulating material, such as transparent plastic or glass. The cover window 40 may be attached to the polarization layer 20 through an adhesive layer 30, such as optically clear adhesive (OCA), optically clear resin (OCR), pressure-sensitive adhesive (PSA), and/or the like.

According to some embodiments, the display device 1000 is substantially flat in the front display area DA1 and curved with the curvature in the side display area DA2 and the corner display area DA3 to form the bent surface. The bent curvature, that is, the curvature radius r, may be constant or variable depending on the position. Thus, the curved display area is referred to as a curved display area DAr. The curved display area DAr includes the side display area DA2 and the corner display area DA3. Accordingly, the display panel 10 may include a curved edge region 10r, the polarization layer 20 may include a curved edge region 20r, and the cover window 40 may include a curved edge region 40r.

Referring to FIGS. 4 and 5, a display device 1000a according to some embodiments is substantially the same as most of the display device 1000. Viewed from the front, the display device 1000a includes the front display area DA1 and the side display area DA2, and the corner display area DA3 disposed at at least two sides of the front display area DA1. The side display area DA2 and the corner display area DA3 are bent with the curvature as described above to form the bent surface.

The corner display area DA3 is capable of stretching and/or shrinking as a whole. That is, the corner display area DA3 may be stretched or shrunk depending on a force applied thereto. The side display area DA2 may be stretched and/or shrunk to the same degree as the corner display area DA3 as a whole, or may have a lower stretching force and/or shrinkage force than the corner display area DA3. The front display area DA1 may have the stretching force and/or shrinkage force of the same degree as the corner display area DA3 or the side display area DA2, or may have a lower stretching force and/or shrinkage force than the corner display area DA3 or the side display area DA2. For example, the front display area DA1 may have a fixed shape or the flexible characteristic such that it is bendable, or may not have substantial stretching and/or contracting forces as the area is stretched or shrunk.

The front display area DA1, the side display area DA2, and the corner display area DA3 include a plurality of display units UT. Each display unit UT may be a pixel that may represent one of the primary colors of red, green, and blue, or a unit group that includes a plurality of pixels. The unit group may include a plurality of pixels representing different primary colors from each other, for example red pixels, green pixels, and blue pixels. The display unit UT may be repeatedly arranged in at least one direction. For instance, FIG. 4 shows an example in which a plurality of display units UT are arranged in the first direction DR1 and the second direction DR2.

Although not shown in FIG. 4, a plurality of display units UT may be disposed in the side display area DA2 and the corner display area DA3, as well as the front display area DA1. The arrangement shape of the plurality of display units UT in the front display area DA1 may be the same as or different from the arrangement shape of the plurality of display units UT in the side display area DA2 or the corner display area DA3. Also, the arrangement shape of the plurality of display units UT in the corner display area DA3 may be different from that of an arrangement shape of a plurality of display units UT in the side display area DA2 or the front display area DA1.

In a plan view, the edge as the edge sides of the display device 1000a may include edges ED1 and ED2 as the edge side of the side display area DA2 and an edge ED3 as the edge side of the corner display area DA3.

Each of the edges ED1 and ED2 of the side display area DA2 may be a straight line substantially extending in the first direction DR1 or the second direction DR2, and the edge ED3 of the corner display area DA3 may be substantially a curved line. The edge ED3 of the corner display area DA3 may be in the form of an arc shape that is part of a circle of which the curvature radius (or radius of curvature) is constant or varied. Both ends of the edge ED3 may be connected to the edges ED1 and ED2 of two side display areas DA2, respectively.

The boundary between the side display area DA2 and the front display area DA1 may also be substantially straight, and the corner display area DA3 may be connected to the corner of the front display area DA1.

At the boundary between the front display area DA1 and the side display area DA2, the front display area DA1 and the side display area DA2 may include one physically continuous substrate and layers stacked thereon, or separate substrates and layers stacked thereon. Similarly, at the boundary between the corner display area DA3 and the side display area DA2 and/or the front display area DA1, the corner display area DA3 may include the substrate or the stacked layers that are physically continuous with the side display area DA2 and/or the front display area DA1, or the separate substrates and stacked layers.

When the corner display area DA3 and the side display area DA2 include one physically contiguous substrate, the edge ED3 may be physically and continuously connected with the edges ED1 and ED2. When the front display area DA1 and the side display area DA2 contain separate substrates and stacked layers, two substrates and stacked layers may be bonded together, and when the corner display area DA3 and the side display area DA2 include separate substrates and stacked layers, two substrates and the stacked layers may be bonded together.

Referring to FIGS. 2 and 5, the curvature radius of the side display area DA2 and the corner display area DA3 is denoted by r, and the length of the edge ED3 of the corner display area DA3 may be approximately $\pi r/2$. On the bent surface or the display surface of the side display area DA2, the distance on the bent surface from the edges ED1 and ED2 to the boundary between the front display area DA1 and the side display area DA2 (hereinafter, simply referred to as a boundary of the front display area DA1) may be approximately πr/2.

FIG. 6 shows an exploded view on a two-dimensional plane as a drawing for the corner AA of a display device 100a before bending the side display area DA2 and the corner display area DA3 of the display device 1000a described above into the bent surface. That is, the side display area DA2 and the corner display area DA3 described in association with FIG. 6 are flat and unfolded before being formed into the bent surface. If the state is subsequently changed to be an unfolded state, it means that the edge region of the display device is in a state before being bent into the bent surface, or in a state in which the bent surface is stretched and contracted again.

Compared with FIG. 5 of the state that the side display area DA2 and the corner display area DA3 as the edge region of the display device are bent, referring to FIG. 6, in the state that the side display area DA2 and the corner display area DA3 are unfolded, the length of the edge EG3 of the corner display area DA3 may be approximately πr/2, and the plan distance from the edges EG1 and EG2 of the side display area DA2 to the boundary between the front display area DA1 and the side display area DA2 may be approximately r.

Here, ED1, ED2, and ED3 represent the edges of the side display area DA2 and the corner display area DA3 in the state that the side display area DA2 and the corner display area DA3 as the edge region of the display device 1000a are bent as the bent surface, and EG1, EG2 and EG3 represent the edges of the side display area DA2 and the corner display area DA3 in the state that the side display area DA2 and the corner display area DA3 are unfolded before being bent in the display device 100a.

The lengths of the edge ED3 of the corner display area DA3 in the unfolded state and the edge EG3 of the corner display area DA3 in the bent surface may all be approximately πr/2. The distance from the edge EG3 of the corner display area DA3 of the unfolded state to the boundary of the front display area DA1 is the same as the curvature radius r; however, the distance on the bent surface from the edge ED3 of the corner display area DA3 to the boundary of the front display area DA1 after the bent surface is formed may be πr/2 as above-described.

Likewise, the distance from the edges EG1 and EG2 of the side display area DA2 of the unfolded state to the boundary of the front display area DA1 is the same as the curvature radius r; however, the distance on the bent surface from the edges ED1 and ED2 of the side display area DA2 of the curved bent surface to the boundary of the front display area DA1 may be πr/2 as above-described.

Accordingly, as indicated by arrows pointing outward in FIG. 6, in the process in which the edge region of the display device 100a is bent, the side display area DA2 and the corner display area DA3 are stretched from the front display area DA1 in the outer direction. For example, the side display area DA2 disposed at the left based on the front display area DA1 is stretched to the left, the side display area DA2 disposed on the upper side is stretched upward, and the corner display area DA3 is stretched outward in the radial direction as indicated by the arrows extending from the edges EG1, EG2, and EG3. Through this process, in the side display area DA2 and the corner display area DA3, the distance (a shortest distance) from each edge EG1, EG2, and EG3 to the boundary of the front display area DA1 on the bent surface, as shown in FIG. 6, starts from distance r and is stretched to distance πr/2, as shown in FIG. 5, in the curved and bent surface, and the side display area DA2 and the corner display area DA3 having the display surface as the bent surface may be formed. That is, in the side display area DA2 and the corner display area DA3, the area thereof is stretched in the process in which the edge region of the display device 100a is bent to form the display device 1000a.

Accordingly, in the state that the side display area DA2 and the corner display area DA3 are unfolded, the distance between the display units UT and/or the area of the display units UT may be different from the state that the side display area DA2 and the corner display area DA3 are formed of the bent surface.

Referring to FIGS. 6 and 7, in the state that the side display area DA2 is unfolded, a pitch Wb1 (an arrangement pitch of adjacent display units UT) in the first direction DR1 of the display units UT in the side display area DA2 adjacent to the front display area DA1 in the first direction DR1 may be smaller than a pitch Wa1 in the first direction DR1 of the display units UT in the front display area DA1. In the side display area DA2, the pitch Wb1 may be constant. For example, the pitch Wb1 may be approximately 1/(π/2) of the pitch Wa1, that is, 2/π. On the other hand, in the side display area DA2 adjacent to the front display area DA1 in the first direction DR1, the pitch Wb2 in the second direction DR2 of the display units UT may be the same as the pitch Wa2 in the second direction DR2 of the display units UT in the front display area DA1. The distance (in the first direction DR1) between the adjacent display units UT in the side display area DA2 may also be smaller than the distance (in the first direction DR1) between the adjacent display units UT in the front display area DA1.

Likewise, in the unfolded state of the side display area DA2, the pitch Wc2 in the second direction DR2 of the display units UT in the side display area DA2 adjacent to the front display area DA1 in the second direction DR2 may be smaller than the pitch Wa2 in the second direction DR2 of the display units UT in the front display area DA1. In the side display area DA2, the pitch Wc2 may be constant. For example, the pitch Wc2 may be approximately 1/(π/2) of the pitch Wa2, that is, 2/π. On the other hand, the pitch Wc1 in the first direction DR1 of the display units UT in the side display area DA2 adjacent to the front display area DA1 in the second direction DR2 may be the same as the pitch Wa1 in the first direction DR1 of the display units UT in the front display area DA1. The distance (in the second direction DR2) between the adjacent display units UT in the side display area DA2 may also be smaller than the distance (in the second direction DR2) between the adjacent display units UT in the front display area DA1.

In the corner display area DA3, the display units UT may be arranged to form a plurality of rows (also referred to as columns) Ur disposed radially. Each column Ur may be a column formed in a radial direction, that is, a direction elongated toward the edge of the corner display area DA3 from the corner of the front display area DA1. Differently from FIG. 7, the display units UT may be further disposed between the adjacent columns Ur.

In the unfolded state of the corner display area DA3 before being formed as the bent surface, the pitch Wr in the radial direction of the display units UT in the corner display area DA3 may be smaller than the pitch Wa1 or the pitch Wa2 of the display units UT in the front display area DA1. The pitch Wr may be the same as the pitch Wb1 in the first direction DR1 of the display units UT disposed in the side display area DA2 adjacent to the front display area DA1 in the first direction DR1 or the pitch Wc2 in the second direction DR2 of the display units UT disposed in the side display area DA2 adjacent to the front display area DA1 in the second direction DR2. In the corner display area DA3, the pitch Wr may be constant. For example, the pitch Wr may be approximately 1/(π/2) of the pitch Wa1 or the pitch Wa2, that is, 2/π. On the other hand, in the corner display area DA3, the distance (in the radial direction) between the adjacent display units UT may also be smaller than the distance (in the first direction DR1 or the second direction DR2) between the adjacent display units UT in the front display area DA1.

However, as shown in FIGS. 1 to 5, in the state that the side display area DA2 and the corner display area DA3 are stretched to form the bent surface, the pitch of the display units UT in the side display area DA2 on the bent surface or the display surface may be almost the same as the pitch of the display units UT in the front display area DA1 on the bent surface or the display surface. That is, before the side display area DA2 and the corner display area DA3 are stretched to form the bent surface, the resolution of the display units UT of the side display area DA2 and the corner display area DA3 may be larger than the resolution of the display units UT of the front display area DA1, but after the side display area DA2 and the corner display area DA3 are stretched to form the bent surface, the resolution on the bent surface or the display surface of the display units UT of the side display area DA2 and the corner display area DA3 may be similar to the resolution of the display units UT of the front display area DA1.

Next, a display device according to some embodiments will be described with reference to FIG. 8 along with the above-described drawings.

Figure 8:
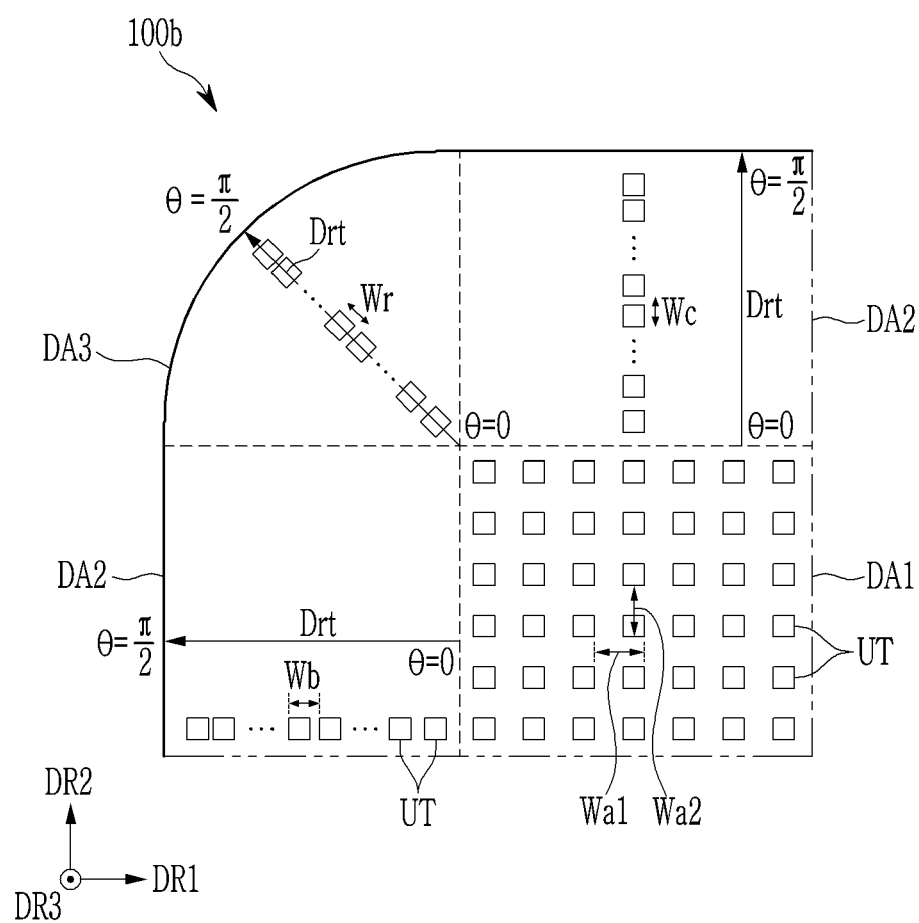

FIG. 8 is a plan exploded view of a corner including an arrangement of display units before bending an edge region of a display device according to some embodiments.

A display device 100b shown in FIG. 8 as the display device 100b in the unfolded state before the edge region of the display device 1000b is formed as the bent surface is the same as most of the display device 100a described in association with FIG. 7; however, the pitch of the display units UT may be changed depending on a position in the side display area DA2 and/or the corner display area DA3. When the direction of the shortest distance from the boundary of the front display area DA1 toward the edge of the side display area DA2 or the corner display area DA3 is referred to as an outer direction Drt, the pitch of the display units UT in the side display area DA2 and/or the corner display area DA3 may become gradually smaller according to the outer direction Drt. For instance, the pitch of the display units UT in the side display area DA2 and the corner display area DA3 may become larger with an increasing distance from the edges EG1, EG2, and EG3.

The pitch Wb in the first direction DR1 of the display units UT in the side display area DA2 adjacent to the front display area DA1 in the first direction DR1 may be smaller than the pitch Wa1 in the first direction DR1 of the display units UT in the front display area DA1, and may become gradually smaller in association with the outer direction Drt. The pitch Wc in the second direction DR2 of the display units UT in the side display area DA2 adjacent to the front display area DA1 in the second direction DR2 may be smaller than the pitch Wa2 in the second direction DR2 of the display units UT in the front display area DA1, and may become gradually smaller in association with the outer direction Drt. Likewise, the pitch Wr in the outer direction Drt or the radial direction of the display units UT in the corner display area DA3 may be smaller than the pitch Wa1 in the first direction DR1 of the display units UT and/or the pitch Wa2 in the second direction DR2 of the display units UT in the front display area DA1, and may become gradually smaller in association with the outer direction Drt.

When the area (e.g., surface area) of the display unit UT is substantially constant, the distance between the adjacent display units UT in the side display area DA2 and/or the corner display area DA3 may become gradually smaller according to the outer direction Drt.

Referring to FIGS. 2 and 8, when the side display area DA2 and the corner display area DA3 are bent and stretched to form the bent surface, the polar angle θ of each position is from 0 to π/2, and the pitches Wb, Wc, and Wr in the outer direction Drt of the display units UT in the unfolded state may be changed depending on the corresponding polar angle θ after the bending process. For example, in the unfolded state, the pitches Wb, Wc, and Wr in the outer direction Drt of the display units UT in the side display area DA2 and the corner display area DA3 as a function of the corresponding polar angle θ may be changed with a ratio of ln(1/cos θ) in the opposite direction to the outer direction Drt. For example, the ratio of the pitches Wb, Wc, and Wr at the position where the polar angle θ is π/6 and the pitches Wb, Wc, and Wr at the position where the polar angle θ is π/3 may be approximately ln(1/cos π/3):ln(1/cos π/6) in sequence.

The ratio (ln(1/cos θ)) be derived from Equation 1 for a stretch ratio (E) of the distance (r*sin θ) on the bent surface where the distance (rθ) is extended in the exploded view based on the origin O in the drawing shown in FIG. 2 described above.

$$\varepsilon = \ln(dy/dx) = \ln(1/\cos\theta), \qquad \text{Equation 1}$$

where:
ln represents a natural logarithm;

$$x = r\theta; \text{ and}$$
$$y = r*\sin\theta$$

Next, the display device according to some embodiments will be described with reference to FIGS. 9 to 13.

Figure 9:
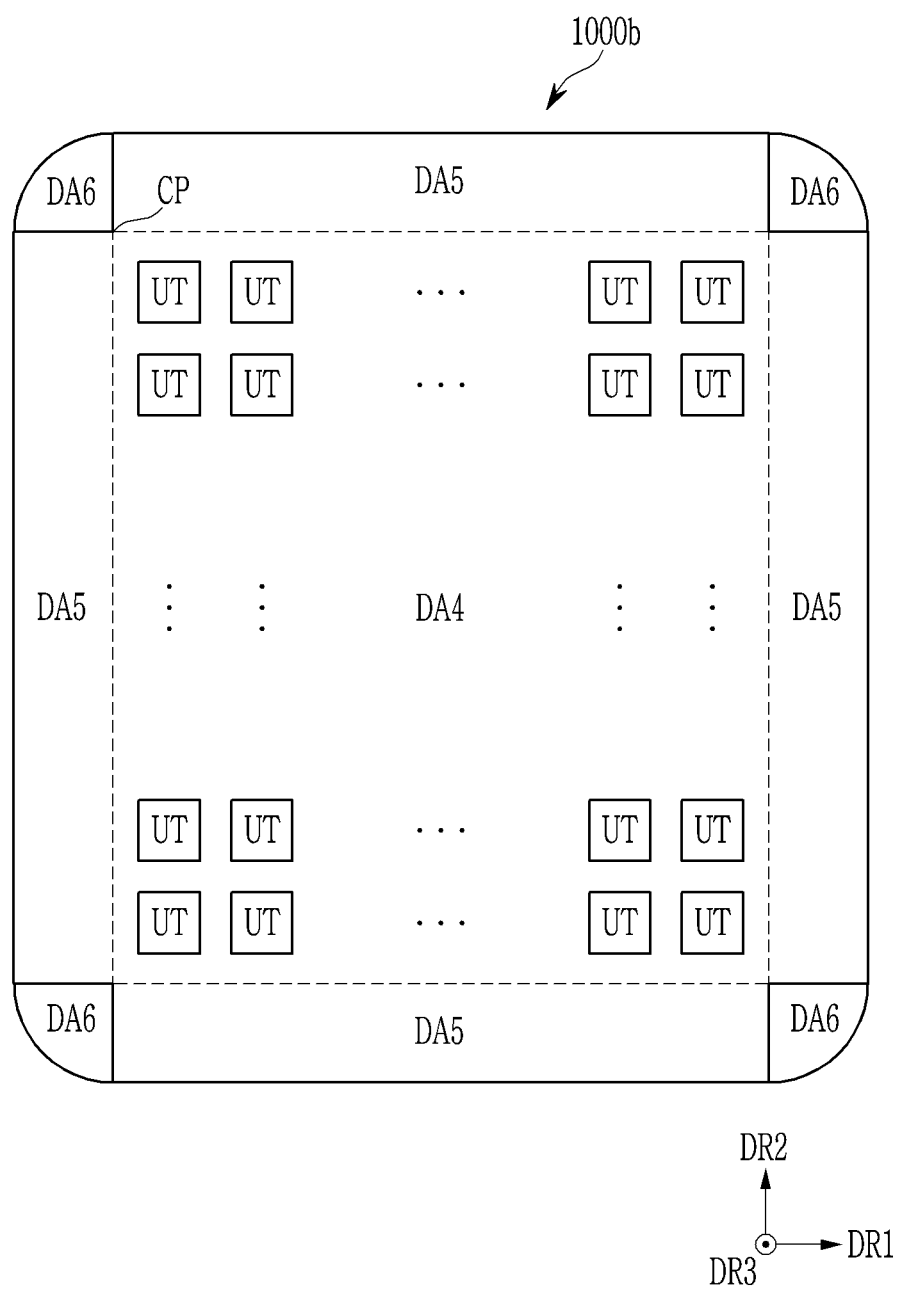
FIG. 9 is a plan layout view of a display device according to some embodiments.
Figure 10:
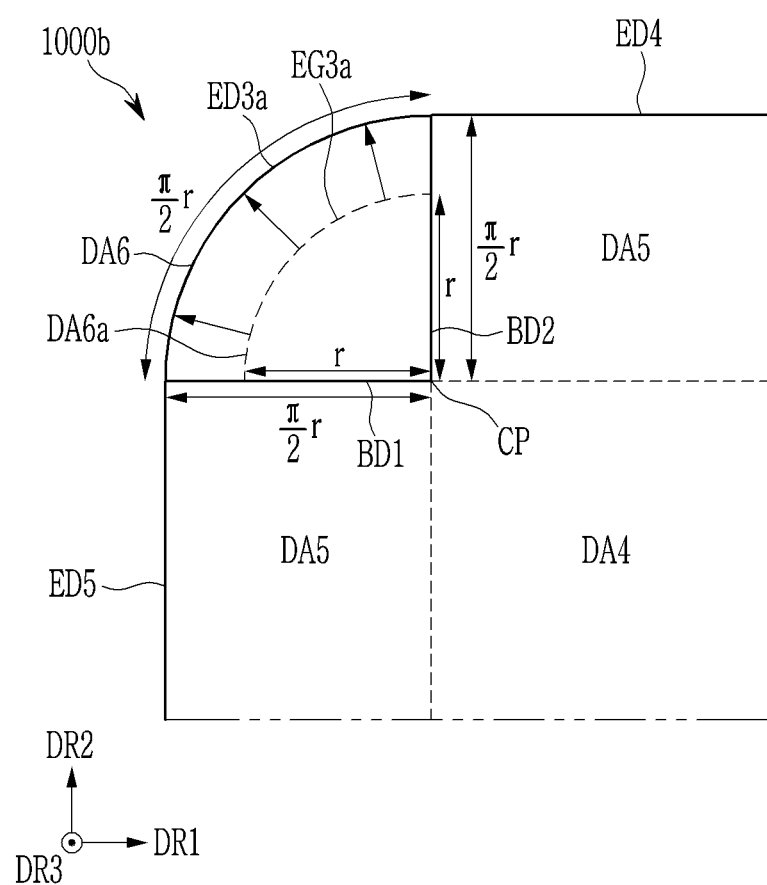
FIG. 10 is a view showing a shape before forming a bent surface and after forming a bent surface in the display device shown in FIG. 9 according to some embodiments.
Figure 11:
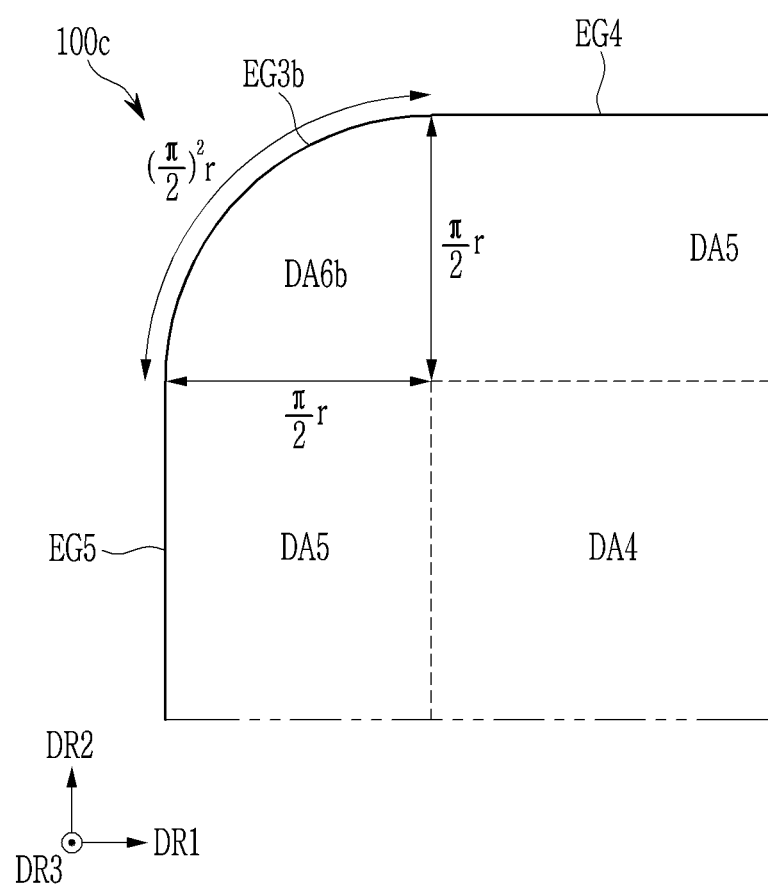
FIGS. 11, 12, and 13 are plan exploded views of a part of a display device before forming a bent surface and after forming a bent surface in a display device according to various embodiments.
Figure 12:
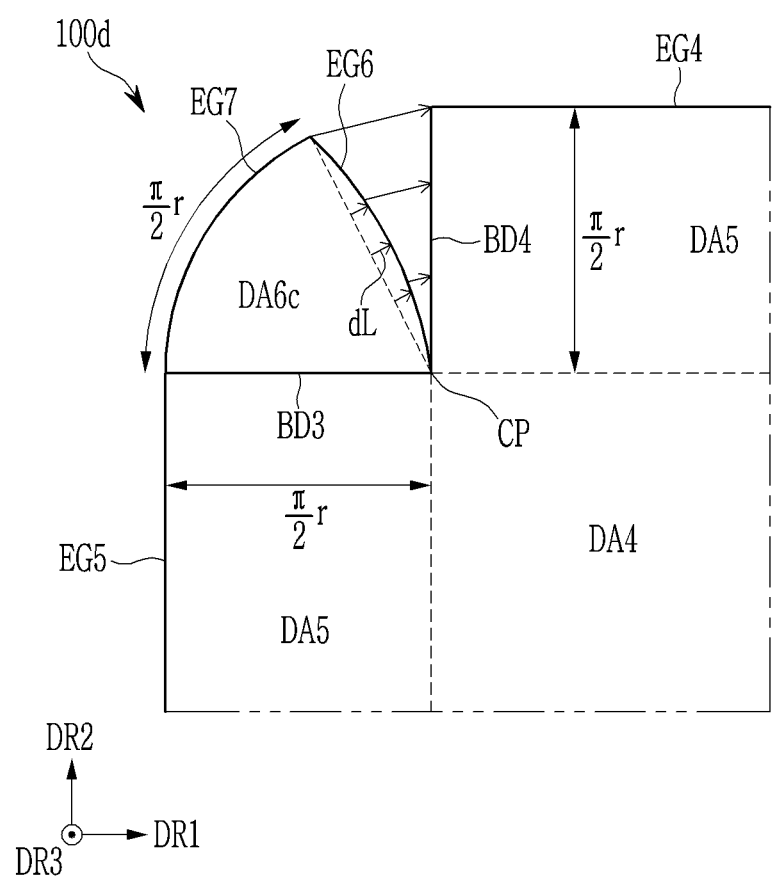
Figure 13:
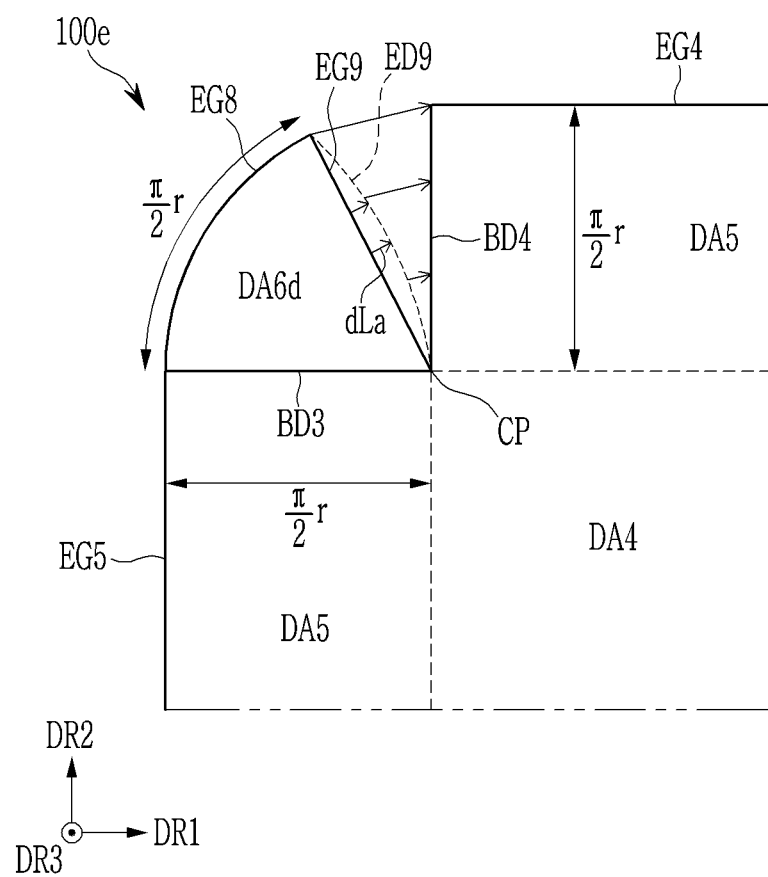

FIG. 9 is a plan layout view of a display device according to some embodiments. FIG. 10 is a view showing a shape before forming a bent surface and after forming a bent surface in the display device shown in FIG. 9 according to some embodiments. FIGS. 11, 12, and 13 are plan exploded views of a part of a display device before forming a bent surface and after forming a bent surface in a display device according to various embodiments.

Referring to FIG. 9, a display device 1000b according to some embodiments is the same as most of the display device 1000; however, the display area includes a front display area DA4, a side display area DA5, and a corner display area DA6. The display areas DA4, DA5, and DA6 may be the same as the shape and arrangement of the display areas DA1, DA2, and DA3 described above, respectively.

As in the previous embodiments, the corner display area DA6 is capable of stretching and/or shrinking; however, the side display area DA5 may have a lower stretching and/or shrinking force than the corner display area DA6, and may have a stretching and/or shrinking force of the same degree as the front display area DA4. For example, the front display area DA4 and the side display area DA5 may have a fixed shape or a flexible characteristic such that they may be bent, but they may have little stretching force and/or shrinking force in which the area is stretched or shrunk.

Although not shown, the pitch of the display units UT disposed in the side display area DA5 may be the same as or similar to the pitch of the display units UT disposed in the front display area DA4. However, when the edge region of the display device is formed of the bent surface, the pitch of the display units UT disposed at (or in) the corner display area DA6 at which some regions are stretched may be smaller than the pitch of the display units UT of the front display area DA4 before the stretching of the corner display area DA6, and may vary depending on the position. The variation ratio may be the same as described in association with FIG. 8.

Before the edge region of the display device 1000b according to some embodiments shown in FIG. 9 becomes the bent surface, the display device may be the same as the various embodiments described in association with FIGS. 10 to 13 according to the corner display area DA6.

First, referring to FIG. 10, the display device 1000b may include the edges ED4 and ED5 as the edges of the side display area DA2, and the edge ED3a as the edge of the corner display area DA6. The edge ED3a may be the same as the edge ED3 of the display device 1000a, and the edges ED4 and ED5 may be the same as the above-described edges ED1 and ED2. The corner display area before being formed of the bent surface is denoted by DA6a.

The front display area DA4 and the side display area DA5 may include one substrate and stacked layers physically continuous to each other, and the corner display areas DA6 and DA6a may include separate substrates and stacked layers physically separated from the front display area DA4 and the side display area DA5 and may be bonded to the substrate and the stacked layers of the front display area DA4 and the side display area DA5.

Although the corner display areas DA6 and DA6a are separated from the side display area DA5 on most of the boundary between the side display area DA5 and the corner display areas DA6 and DA6a and include the substrates and stacked layers bonded to each other, the corner display areas DA6 and DA6a may include the substrate and stacked layers that are physically and continuously connected to the front display area DA4 on a connection point CP as the boundary between the corner display areas DA6 and DA6a and the front display area DA4. That is, the corner display areas DA6 and DA6a include the same substrate and stacked layers as the front display area DA4 and the side display area DA5, however, the corner display areas DA6 and DA6a and the side display area DA5 may be separated from each other on the boundary with the side display area DA5 and may be connected to the front display area DA4 with the continuous substrate and stacked layers through the connection point CP. The connection point CP may be a region having a certain area rather than a dot. For instance, the continuous substrate and stacked layers may be cut along boundaries DB1 and DB2 to separate the substrate and stacked layers as previously described, but may remain as the continuous substrate and stacked layers in the connection point CP.

The edge ED3a is connected to the edges ED4 and ED5, but may be in a bonded state. Wiring that may supply the signals to the corner display areas DA6 and DA6a (e.g., supply signals to the display units UT) can pass at the connection point CP.

Before the edge region of the display device 1000b is stretched to be the bent surface, in the corner display area DA6a of the display device according to some embodiments, the length of the edge EG3a before the stretched state may be $\pi r/2$, and the length of the side of the corner display area DA6a forming the boundary with the side display area DA5 may approximately be the curvature radius r.

Since the side display area DA5 is not to be substantially stretched to form the bent surface, the distance from the boundary of the front display area DA4 to the edge ED5 of the side display area DA5 is approximately $\pi r/2$, and this length may be bent at it is to form the bent surface. On the other hand, the length of the radial direction from the connection point CP of the corner display area DA6a starts from r, is extended in the arrow direction shown in FIG. 10, and becomes approximately $\pi r/2$ in the bent surface state. The corner display area DA6 as stretched may be bonded to the side display area DA5 to be fixed in the state of forming the bent surface.

Referring to FIG. 11, for a display device 100c according to some embodiments, the edge region may be bent to have the bent surface of the same shape as the display device 1000b described in association with FIG. 9. The display device 100c in the unfolded state is the same as most of the unfolded state of the display device 1000b described in association with FIG. 10; however, the corner display area DA6b may be different.

The corner display area DA6b is continuously connected to the side display area DA5 even in the unfolded state, and the edge EG3b of the corner display area DA6b is continuously connected with the edges EG4 and EG5 of the side display area DA5. The substrate and stacked layers of the corner display area DA6b may be continuously connected to the substrate and stacked layers of the side display area DA5 and the front display area DA4. When the side display area DA5 of the display device 100c is bent into the bent surface, the side display area DA5 is not substantially stretched and is bent while the distance from the boundary of the front display area DA4 to the edges EG4 and EG5 of the side display area DA5 is maintained at approximately $\pi r/2$, thereby, having the distance of approximately $\pi r/2$ even when it is the bent surface.

In the unfolded state before forming the bent surface, the length of the edge EG3b of the corner display area DA6b is $(\pi/2)2r$, and in the state that the corner display area DA6b is bent to form the bent surface, the length is $\pi r/2$ as shown in FIG. 2 or FIG. 10. That is, when the corner display area DA6b starts from the unfolded state and is bent to form the bent surface, the length of the edge EG3b may be reduced from $(\pi/2)2r$ to $\pi r/2$. Accordingly, a part of the entire region of the corner display area DA6b is contracted and a part of the corner display area DA6b is stretched, thereby the corner display area DA6b may be bent in the bent surface as shown in FIG. 2 from the flat state on the two-dimensional flat structure shown in FIG. 11.

Referring to FIG. 12, the edge region may be bent so that a display device 100d according to some embodiments has the bent surface of the same shape as the display device 1000b described in association with FIG. 9. The display device 100d in the unfolded state before the edge region forms the bent surface is the same as most of the display device 100c described in association with FIG. 10, but the corner display area DA6c may be different.

Unlike the above-described display devices, the corner display area DA6c does not need to be stretched, and thus, may not be the stretchable region. That is, the corner display area DA6c may not be stretchable like the side display area DA5 and the front display area DA4. However, the corner display area DA6c may be stretchable.

The corner display area DA6c may be physically and continuously connected or bonded to one of two neighboring side display areas DA5 in the unfolded state to form the boundary BD3. Thus, the edge EG7 of the corner display area DA6c is continuously connected to the edge EG5 of the side display area DA5 to which the corner display area DA6c is connected. The length of the edge EG7 of the corner display area DA6c may be approximately $\pi/2$.

The corner display area DA6c further includes the edge EG6 facing the boundary BD4 of the side display area DA5 which it is not connected. The edge EG6 is disconnected from the edge EG7 and separated from the side display area DA5 in the unfolded state. The edge EG6 may be a smooth curved line (e.g., arcuately formed) without a straight line; however, embodiments are not limited thereto. When drawing a virtual (or imaginary) straight line from the connection point CP to the intersection point of the edge EG7 and the edge EG6, the increased distance dL (meaning the shortest distance in the vertical direction to the imaginary straight line) from the virtual straight line to the edge EG6 may be different depending on the position of the edge EG6, and for example, it may be determined according to Equation 2 with reference to FIG. 2.

$$dL/r = \theta - (\pi/2)\sin\theta \qquad \text{Equation 2}$$

According to Equation 2, the distance between the edge EG6 and the virtual straight line may be greatest in the middle of the edge EG6.

The length of the edge EG6 of the corner display area DA6c may be approximately $\pi r/2$. The edge EG6 of the corner display area DA6c may be bent to form the bent surface in three dimensions without contraction or stretching to meet the boundary BD4 of the side display area DA5 and the edge EG6 and the boundary BD4 to be bonded to each other. The shape of the display device in which the bent surface is formed may have the same shape as the display device 1000b described in association with FIGS. 9 and 10. In this manner, the separate substrate and the stacked layers along the edge EG6 may be bonded to the separate substrate and the stacked layers along the boundary BD4.

Referring to FIG. 13, the edge region may be bent so that a display device 100e according to some embodiments has the bent surface of the same shape as the display device 1000b as described in association with FIG. 9. The display device 100e in the unfolded state before the edge region forms the bent surface is the same as most of the display device 100d described in association with FIG. 12, but the corner display area DA6d may be different. The corner display area DA6d is stretchable so that the area may be increased when the corner display area DA6d forms the bent surface.

The corner display area DA6d may be continuously and physically connected or bonded to one of two neighboring side display areas DA5 in the unfolded state to form the boundary BD3. For instance, the edge EG8 of the corner display area DA6d is continuously connected to the edge EG5 of the side display area DA5 to which the corner display area DA6d is connected. The length of the edge EG8 of the corner display area DA6d may be approximately $\pi r/2$.

The corner display area DA6d further includes the edge EG9 facing the boundary BD4 of the side display area DA5 which it is not connected. The edge EG9 is connected with the edge EG8 and is separated from the side display area DA5 in the unfolded state. The edge EG9 may be a straight line connecting from the connection point CP to the end of the edge EG8, unlike the above-described edge EG6, which was arcuately formed.

When the corner display area DA6d is stretched to form the bent surface, the edge EG9 may be stretched or form a new edge ED9 in three dimensions. The edge ED9 may be the curved line configuration. The increased distance (dLa) (which means the shortest distance in the direction perpendicular to the edge EG9 from the edge EG9 before the stretching to the edge ED9 of the curved line) may vary depending on the position, and for example, may be determined according to Equation 2 described above with reference to FIG. 12. That is, the distance dLa may be determined in the same manner as the distance dL.

In the state that the corner display area DA6d forms the bent surface, the length of the new edge ED9 may be approximately $\pi r/2$. After being bent, the edge ED9 meets the boundary BD4 of the side display area DA5, and the edge ED9 and the boundary BD4 may be connected to each other. Thus, the shape of the display device in which the bent surface is formed may have the same shape as the display device 1000b described in association with FIGS. 9 and 10A.

According to various embodiments, the display device having the corner display areas DA3 and DA6 capable of displaying the image may be provided by also rounding the corner of the display devices 1000a and 1000b, and the shape of the rounded corner display areas DA3 and DA6 may be enhanced.

Next, a display device 1000c according to an embodiment is described with reference to FIG. 14.

Figure 14:
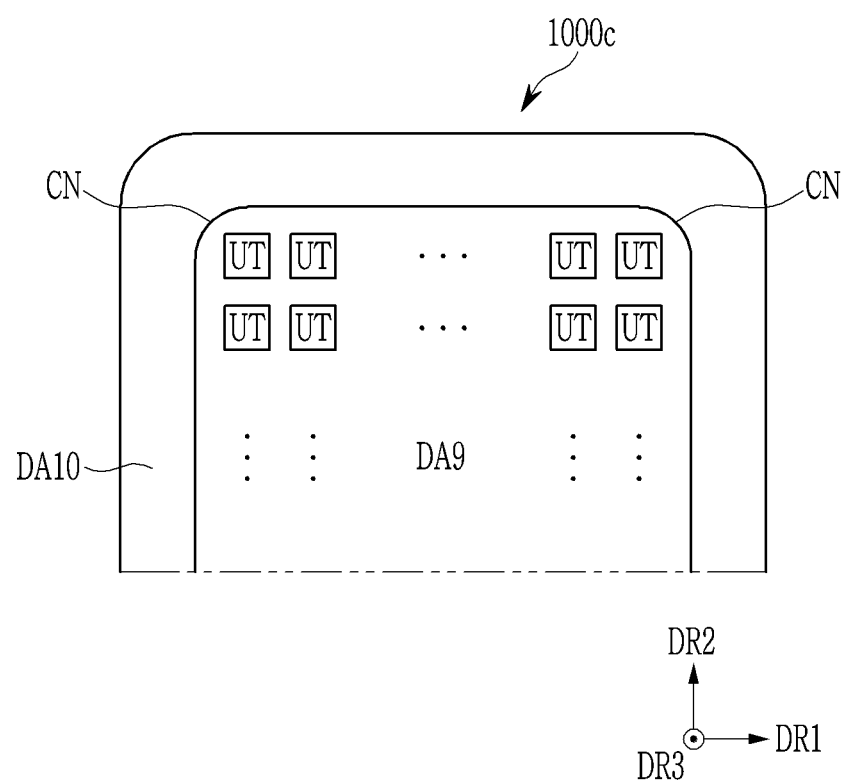
FIG. 14 is a plan layout view of a display device according to some embodiments.

FIG. 14 is a plan layout view of a display device according to some embodiments.

The display device 1000c according to some embodiments may be the same as the display device (e.g., each of the display devices of the shape forming the bent surface or the shape before forming the bent surface) as previously described; however, the front display area DA9 corresponding to the above-described front display areas DA1 and DA4 and surrounding the display area DA10 corresponding to the above-described side display areas DA2 and DA5 and corner display areas DA3 and DA6 may be further included. The corner CN of the front display area DA9 may be rounded rather than pointed (or formed as a vertex). Thus, the shape of the corner CN of the display device 1000c in which the surrounding display area DA10 constitutes the bent surface may have a bent (e.g., perfectly bent surface) and the boundary between the surrounding display area DA10 and the front display area DA9 may have a more perfectly round shape, and, as such, there may be no part recognized as an edge between the front display are DA9 and the surrounding display area DA10.

Next, a method for manufacturing a display device according to some embodiments will be described with reference to FIGS. 15 and 16. For instance, the method for laminating the display panel with a cover window is described. The polarization layer 20 shown in FIG. 3 is omitted for convenience.

Figure 15:
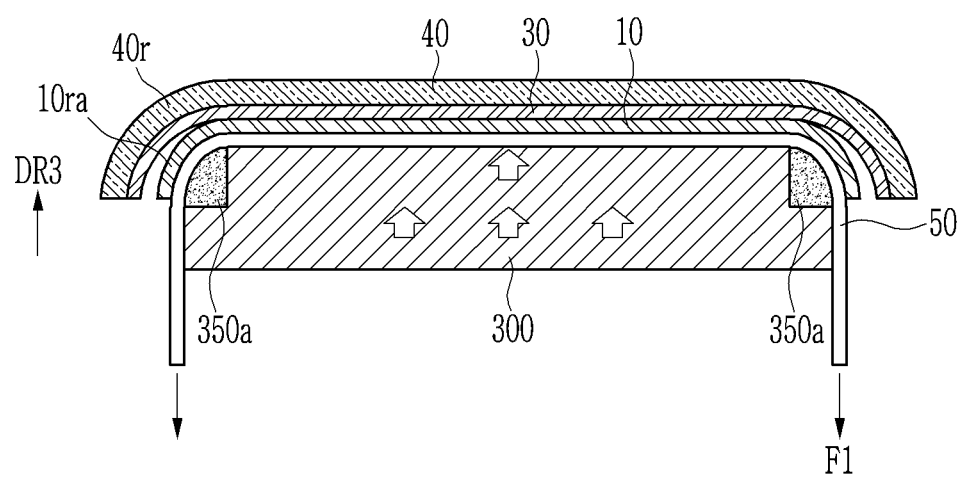
FIG. 15 is a lateral view showing a process of a manufacturing method of a display device according to some embodiments.

FIG. 15 is a lateral view showing a process of a manufacturing method of a display device according to some embodiments. FIG. 16 is a lateral view showing an additional process of the manufacturing method in FIG. 15 according to some embodiments.

First, referring to FIG. 15, a laminate device may include a pad unit including a shape pad 300 and an edge pad 350a disposed at the edge of the shape pad 300. Although not shown, one or more jigs may be disposed under the pad unit.

The elastic coefficient of the edge pad 350a (also known as the modulus) is lower than the elastic coefficient of the shape pad 300 so that the shape of the edge pad 350a may be more varied, e.g., may be more varied under load. The edge pad 350a may be formed along the edge of the top portion of the shape pad 300. Alternatively, the edge pad 350a may include an air pump or may be connected to an air pump so that the shape and volume of the edge pad 350a may vary depending on the air pressure.

After attaching an adhesive sheet 50 to the underside of the display panel 10, the display panel 10 is disposed on the pad unit. In the case of the edge pad 350a having higher elasticity than the shape pad 300, the adhesive sheet 50 may be pulled in the downward direction F1 so that the edge pad 350a has a minimum (or at least decreased) volume. The edge region of the display panel 10 may not substantially extend, and an edge region 10ra constituting the bent surface may be formed. If the edge pad 350a includes an air pump or is connected to an air pump, the edge pad 350a may be in a state of a minimum volume at a minimum air pressure.

Next, the adhesive layer 30 is formed on the bottom surface of the cover window 40 as described above, and the cover window 40 is placed on the pad unit. The cover window 40 may include an edge region 40r that is bent to form the bent surface.

Then, as a jig beneath the pad unit rises, the central portion of the display panel 10 on the shape pad 300 may first come in contact with the adhesive layer 30. The central portion of the display panel 10 in contact with the adhesive layer 30 may correspond to the above-described front display areas DA1 and DA4. The direction of the adhesive sheet 50 may be adjusted so that the edge region 10ra of the display panel 10 is not in contact with the adhesive layer 30 under the cover window 40.

Figure 16:
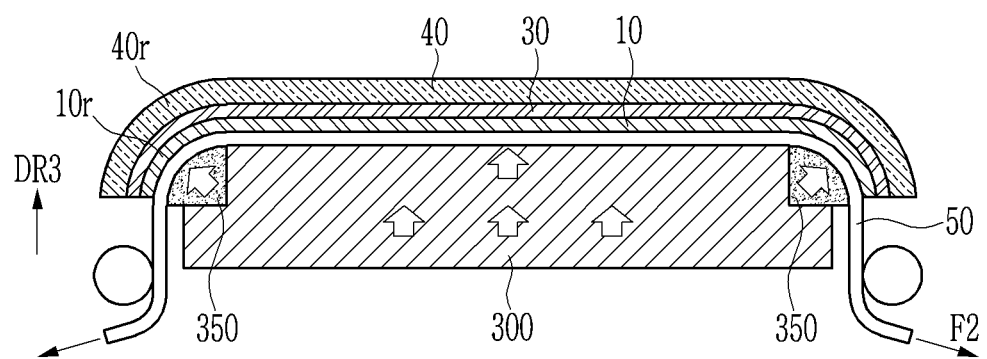
FIG. 16 is a lateral view showing an additional process of the manufacturing method in FIG. 15 according to some embodiments.

Next, referring to FIG. 16, the volume of the edge pad 350a is increased to be an increased edge pad 350. For this purpose, in the case of an edge pad 350a having higher elasticity than that of the shape pad 300, the direction F2 of pulling the adhesive sheet 50 may be adjusted so that the volume of the edge pad 350a may be increased. At this time, the edge region 10ra of the display panel 10, which has not yet contacted the adhesive layer 30, may be stretched to form the edge region 10r that forms the bent surface of the side display areas DA2 and DA5 and the corner display areas DA3 and DA6 of the above-described several embodiments. If the edge pad 350a includes an air pump or is connected to the air pump, the volume of the edge pad 350a may be increased by increasing the air pressure. In this process, the edge region 10r of the display panel 10 comes in contact with the adhesive layer 30, so that the entire display panel 10 may be bonded to the window 40 through the adhesive layer 30. The shape of the edge region 10r of the display panel 10 may have the bent surface according to the several examples described above. Thereafter, the adhesive sheet 50 may be removed.

According to above-noted process, it is possible to easily manufacture the corner display areas DA3 and DA6 of the rounded shape that are disposed at the corners of the variously described display devices.

An example of the display units UT disposed in the display area of the display devices according to various embodiments will be described with reference to FIGS. 17 and 18.

Figure 17:
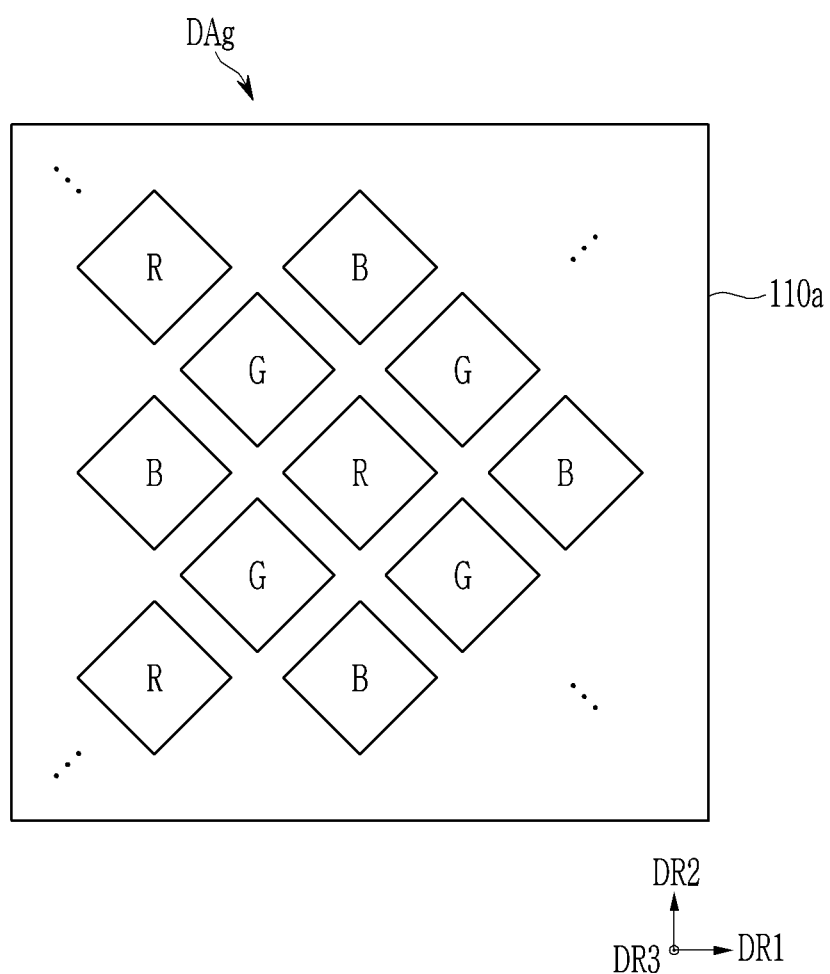
FIG. 17 is a layout view of pixels of a display area of a display device according to some embodiments.

FIG. 17 is a layout view of pixels of a display area of a display device according to some embodiments. FIG. 18 is a layout view of pixels of a display area of a display device according to some embodiments.

FIG. 17 shows an example of the display unit UT to be disposed in the display area DAg where the stretching and/or shrinking need not be possible in the above-described several embodiments, for example, the front display area DA1 and DA4 or the side display area DA5. The display area DAg includes the substrate 110a, and the substrate 110a may be flexible or rigid, but may not be substantially stretched and/or shrunk. The display unit UT may be the pixels R, G, and B, each of which may emit light of one primary color as described above, or a plurality of pixels R, G, and B representing different primary colors.

Figure 18:
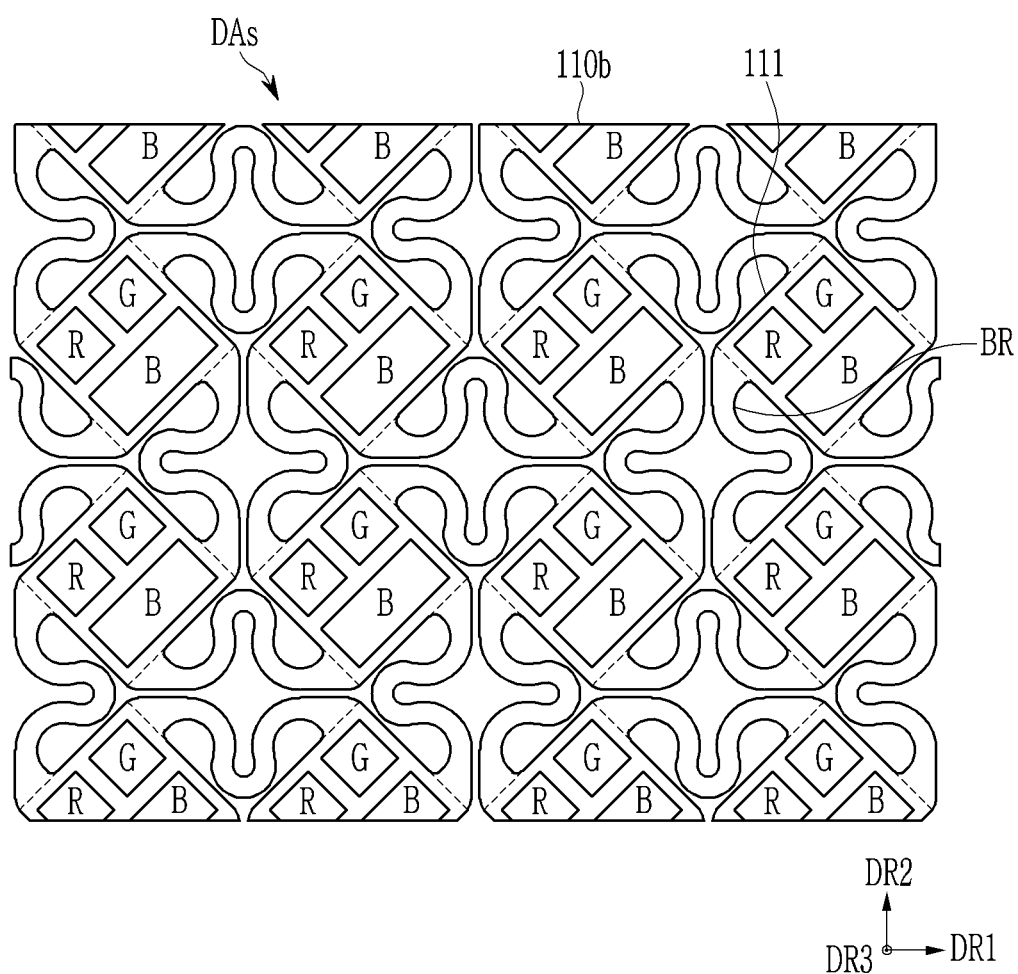
FIG. 18 is a layout view of pixels of a display area of a display device according to some embodiments.

FIG. 18 shows an example of the display unit UT to be disposed in the display area DAs that may be stretched and/or shrunk in the several above-described embodiment, for example the corner display areas DA3 and DA6 or the side display area DA2. The display area DAs includes the substrate 110b and the substrate 110b is capable of stretching and/or shrinking structurally or materially. The substrate 110b, which is structurally stretchable and/or shrinkable, as shown in FIG. 18, may include a plurality of main units (or portions) 111 and a plurality of bridges BR connecting the adjacent main units 111 to each other. Each bridge BR may be bent with a variety of curvature radiuses and may be easily flexed, and if a force is applied to the display area DAs, the substrate 110b of the display area DAs can be easily stretched and/or retracted without damage to the main unit 111. When the substrate 110b is stretched and/or shrunk, the shape of the bridge BR changes and the main unit 111 itself may rotate and/or be displaced (e.g., translate) without deformation.

In each main unit 111, a plurality of pixels R, G, and B may be disposed. In this case, the display unit UT may be one main unit 111 or one pixel R, G, or B.

A peripheral area of the display device according to the several embodiments will be described with reference to FIGS. 19 to 23 along with the above-described drawings.

Figure 19:
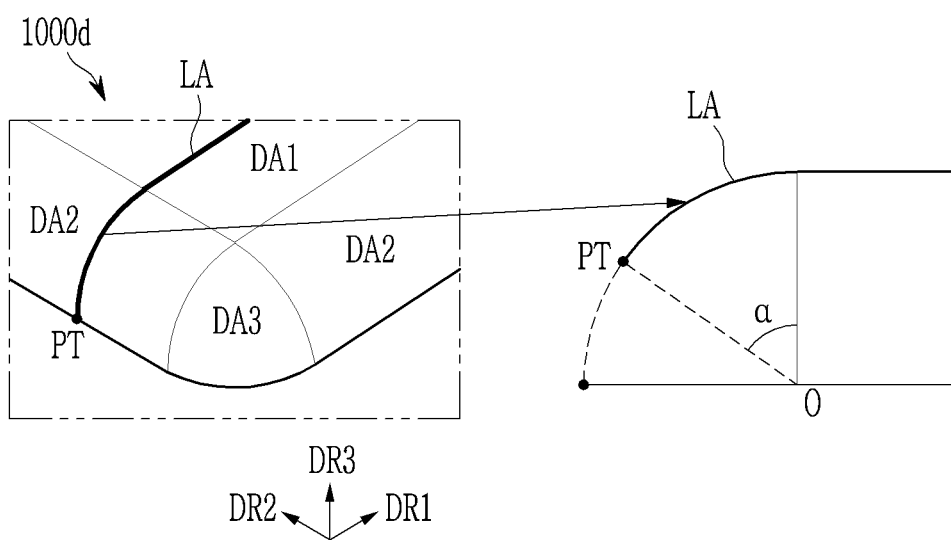
FIGS. 19 and 20 are schematic perspective views and cross-sectional views of a display device according to various embodiments.

FIG. 19 is a schematic perspective view and a cross-sectional view of a display device according to some embodiments.

Referring to FIG. 19, the display device 1000d is the same as most of the display devices 1000, 1000a, 1000b, and 1000c; however, the shape of the bent surface of the peripheral area including the side display area DA2 and the corner display area DA3 may be different.

For instance, referring to FIG. 19 along with FIG. 2, when viewing a section of the display device 1000d along a line LA, the angle α formed by the bent surface of the side display area DA2 and the corner display area DA3 with respect to the origin O may be greater than or equal to 0 degrees and less than or equal to 90 degrees. FIG. 19 shows an example in which the angle α is larger than 0 degrees and smaller than 90 degrees. That is, on the bent surface of the side display area DA2 and the corner display area DA3, the angle α corresponding to the part from the point PT where the line LA meets the edge of the display device 1000d to the boundary between the side display area DA2/the corner display area DA3 and the front display area DA1 may be more than 0 degrees to less than 90 degrees.

Figure 20:
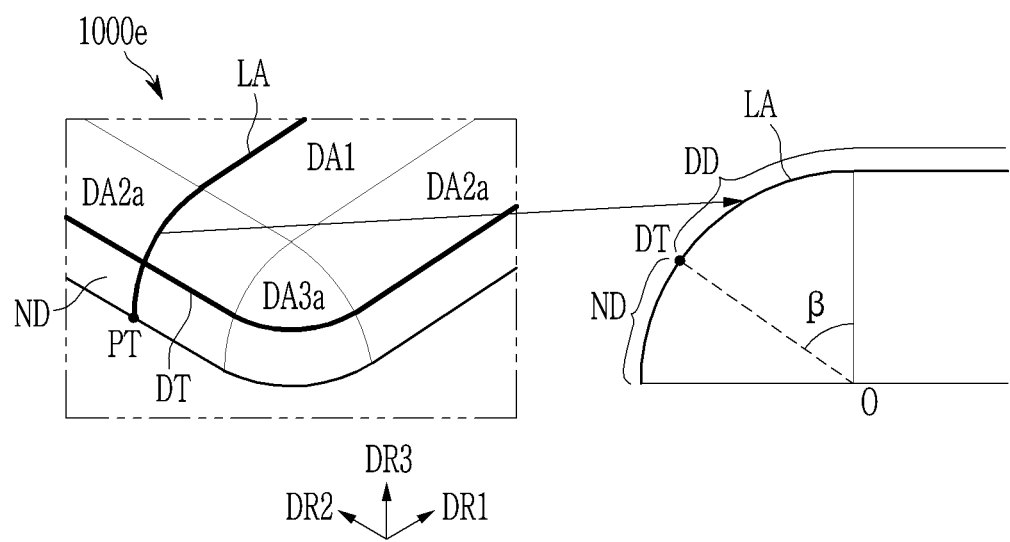
Figure 21:
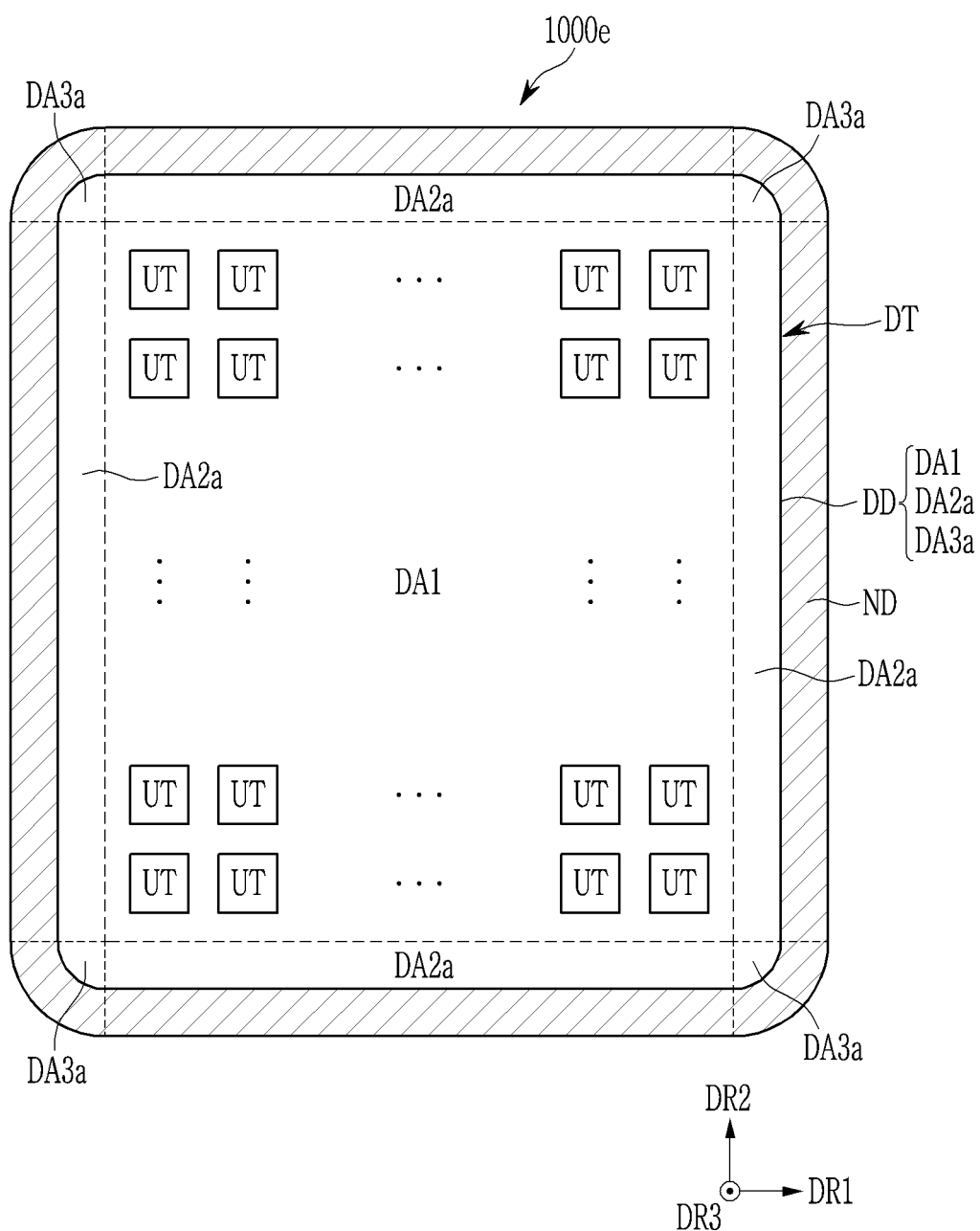
FIGS. 21, 22, and 23 are plan layout views of a display device according to various embodiments.
Figure 22:
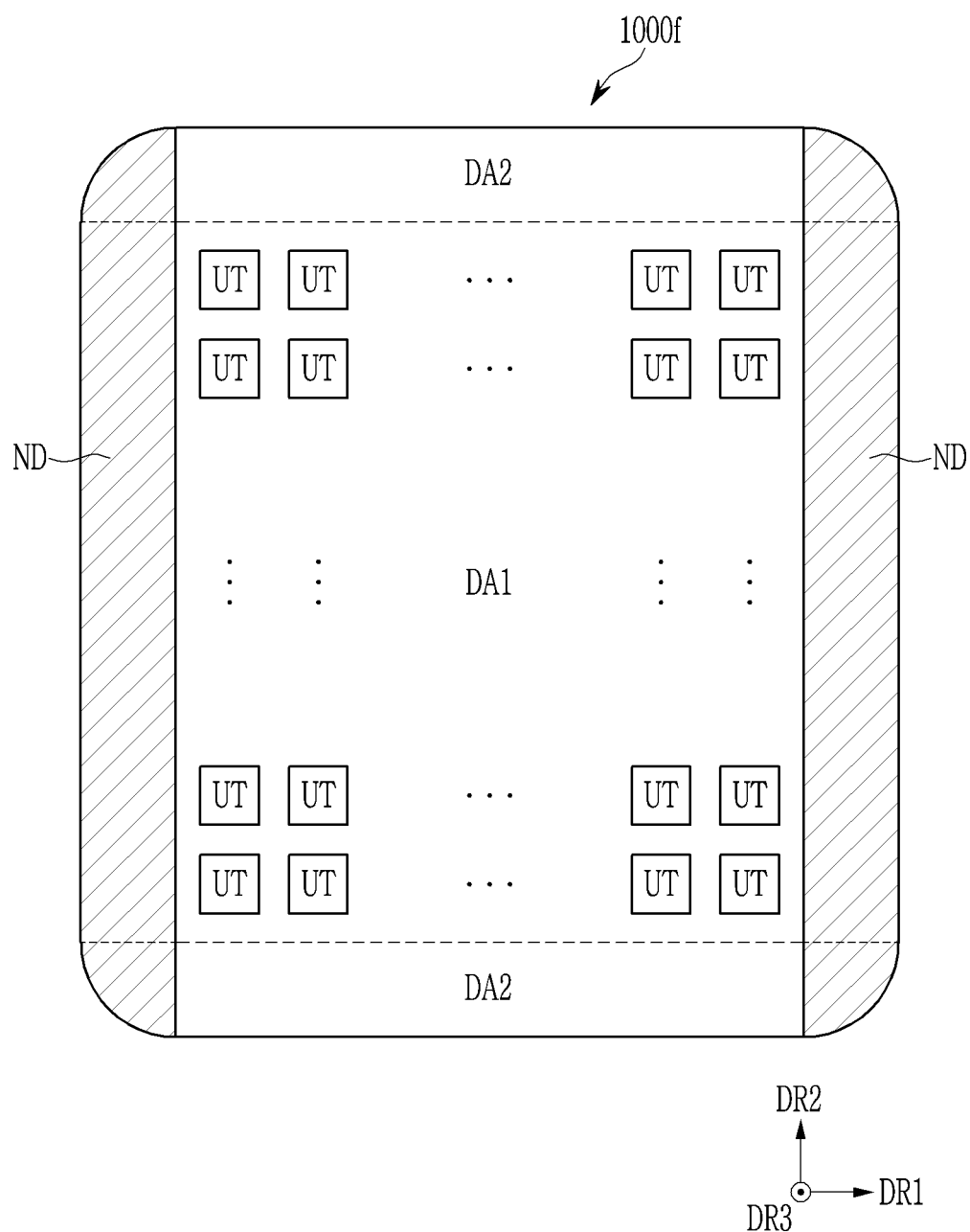
Figure 23:
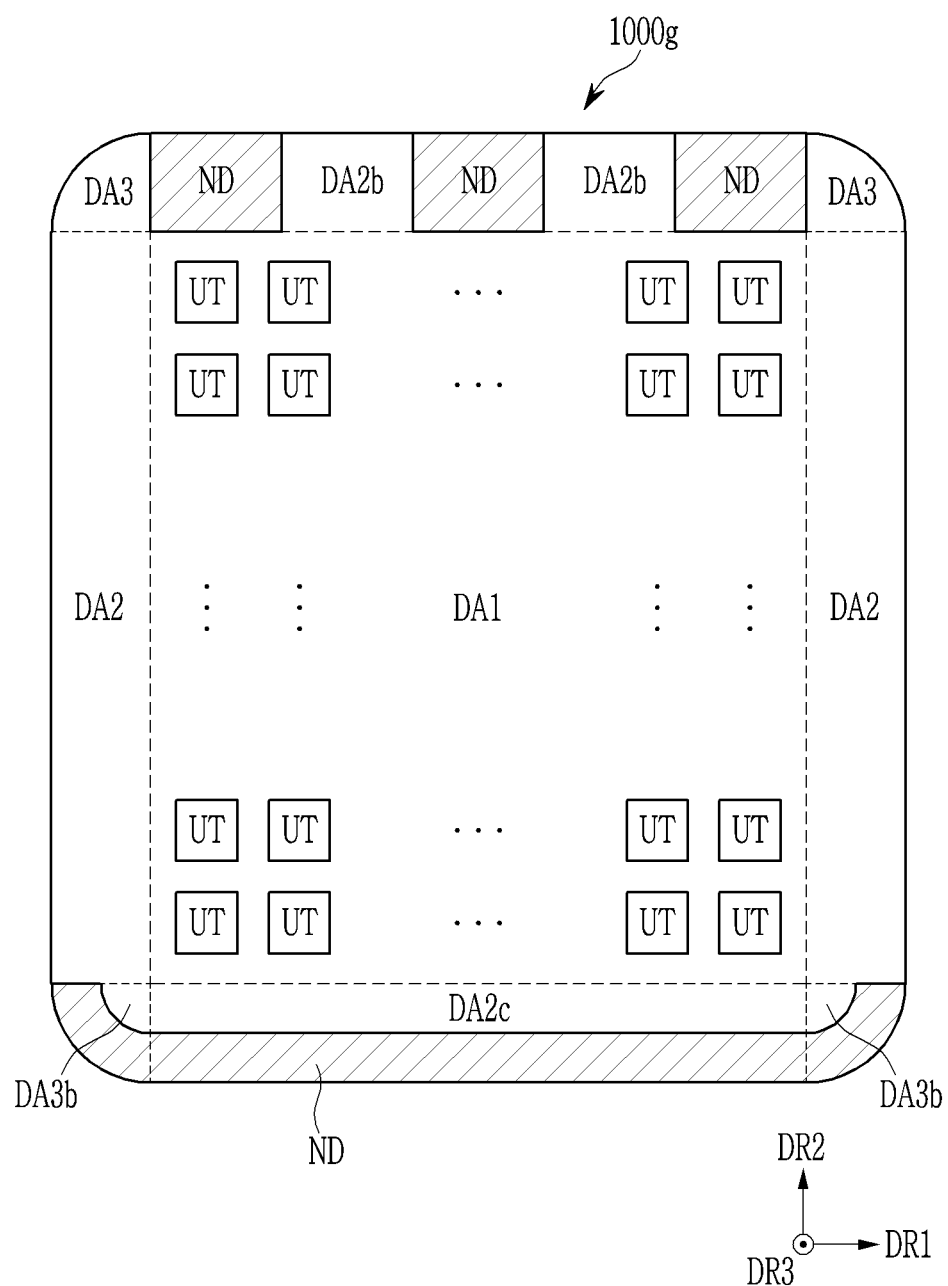

FIG. 20 is a schematic perspective view and a cross-sectional view of a display device according to some embodiments. FIGS. 21 to 23 are plan layout views of a display device according to various embodiments.

The display devices according to the various embodiments shown in FIGS. 20 to 23 are the same as most of the display devices 1000, 1000a, 1000b, 1000c, and 1000d;

however, only part among the side display area DA2 and the corner display area DA3 may be included in the display area for displaying the image.

First, referring to FIGS. 20 and 21, in the display device 1000e, only part of the above-described side display area DA2 and part of the above-described corner display area DA3 is the display area displaying the image to be the side display area DA2a and the corner display area DA3a, and the rest of the region may be a non-display area ND. The side display area DA2a and the corner display area DA3a may be adjacent to the front display area DA1 based on the boundary DT, and the outer region adjacent to the edge of the display device 1000e may be the non-display area ND.

Referring to FIGS. 2 and 20, the angle β formed by the bent surface of the side display area DA2a and the corner display area DA3a with respect to the origin O may be greater than 0 degrees and less than 90 degrees when viewing the section of the display device 1000e along the line LA. That is, on the bent surface of the side display area DA2a and the corner display area DA3a, the angle β corresponding to the part from the point where the line LA meets the boundary DT to the boundary between the side display area DA2a/corner display area DA3a and the front display area DA1 may be greater than 0 degrees and less than 90 degrees.

The front display area DA1, the side display area DA2a, and the corner display area DA3a in one display device 1000e may form one continuous display area DD. Thus, as described in association with FIGS. 20 and 21, the non-display area ND may have a shape surrounding the surroundings of the display area DD.

FIG. 22 shows an example of a display device 1000f in which the side display area DA2 and the entire corner display area DA3 disposed on the left and the right based on the front display area DA1 are included in the non-display area ND, and, as such, do not display the image. That is, the front display area DA1 and the side display area DA2 disposed on the top and bottom sides of the front display area DA1 can form one continuous display area.

Referring to FIG. 23, a plurality of separated side display areas DA2b may be disposed on one side or a plurality of sides of the front display area DA1, and the non-display area ND may be disposed between the adjacent side display areas DA2b or between the side display area DA2b and the corner display area DA3.

Also, like as described in association with FIG. 20 and FIG. 21, only part of the peripheral area around the front display area DA1 may be the side display area DA2c and the corner display area DA3b for displaying the image and the rest of the region may be the non-display area ND. FIG. 23 shows an example in which the side display area DA2c and the corner display area DA3b are disposed downward based on the front display area DA1, and the non-display area ND is disposed outside of the side display area DA2c and the corner display area DA3b. The side display area DA2c and the corner display area DA3b may be disposed adjacent to the front display area DA1, and the non-display area ND may be disposed outside and adjacent to the edge of the display device 1000g.

Although certain embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising: a front display area; a plurality of side display areas; and a corner display area, wherein the plurality of side display areas and the corner display area are disposed outside of the front display area, wherein the plurality of side display areas comprise: a first side display area adjacent to the front display area in a first direction; and a second side display area adjacent to the front display area in a second direction generally perpendicular to the first direction, wherein the corner display area is disposed at a corner of the front display area between the first side display area and the second side display area, the corner display area being connected to the first side display area and the second side display area, and wherein: the front display area has a flat display surface; the first side display area, the second side display area, and the corner display area respectively form a bent surface; the first side display area comprises a first edge; the corner display area comprises: a second edge connected to the first edge of the first side display area in an unbent state of the corner display area; and a third edge connected to the second edge in the unbent state of the corner display area; each of the second edge and the third edge forms a curved line; and in a bent state of the corner display area in which the bent surface is formed, the third edge is bonded to the second side display area; and the front display area comprises a plurality of first display units, and the plurality of first display units respectively have a first extending in the second direction and a second side extending in the first direction; and the first side display area comprises a plurality of second display units, and the plurality of second display units respectively have a first side extending in the second direction and a second side extending in the first direction; in an unbent state of each of the first side display areas, a first pitch, which is a distance between first sides of two of the first display units adjacent each other in the first direction, is greater than a second pitch, which is a distance between first sides of two of the second display units adjacent each other in the first direction, and a third pitch, which is a distance between second sides of two of the first display units adjacent each other in the second direction, is substantially the same as a fourth pitch, which is a distance between second sides of two of the second display units adjacent each other in the second direction; and in a bent state of each of the first side display areas, the first pitch is substantially the same as the second pitch, and the third pitch is substantially the same as the fourth pitch.

2. The display device of claim 1, wherein
the bent surface of the corner display area has a shape different from that of the bent surface of the first side display area and that of the bent surface of the second side display area.

3. The display device of claim 2, wherein
each of the first side display area, and the second side display area is stretchable and/or shrinkable.

4. The display device of claim 1, wherein:
in an unbent state of the first side display area, the second side display area, and the corner display area:
the second display units have a pitch in a first direction generally perpendicular to the first edge of the first side display area smaller than a pitch of the first display units in the first direction; and
the third display units have a pitch in a second direction generally perpendicular to the second edge is smaller than a pitch of the first display units in the first direction.

5. The display device of claim 1, wherein, in an unbent state of the first side display area, the second side display area, and the corner display area:

the pitch of the second display units in the first direction is gradually reduced toward the first edge; and the pitch of the third display units in the second direction is gradually reduced toward the second edge.

6. The display device of claim 1, wherein:

a radius of curvature of the first side display area and a radius of curvature of the corner display area is r;

a length of the second edge is $\pi r/2$; and a distance from the first edge of the first side display area to a boundary between the front display area and the first side display area is $\pi r/2$.

7. The display device of claim 4, wherein a length of the third edge is $\pi r/2$.

8. A display device comprising: a first display area, and a second display area disposed around the first display area; the second display area comprising a plurality of side display areas; and a corner display area, wherein the plurality of side display areas and the corner display area are disposed outside of the front display area, wherein the plurality of side display areas comprise: a first side display area adjacent to the front display area in a first direction; and a second side display area adjacent to the front display area in a second direction generally perpendicular to the first direction, wherein the corner display area is disposed at a corner of the front display area adjacent to the first side display area and the second side display area, the corner display area being connected to the first side display area and the second side display area, wherein: the first display area has a flat display surface; the second display area forms a bent surface; and to form the bent surface, a force to stretch and/or shrink the second display area is smaller than a force to stretch and/or shrink the first display area. wherein: the first display area comprises a plurality of first display units, and the plurality of first display units respectively have a first extending in the second direction and a second side extending in the first direction; and the second display area comprises a plurality of second display units, and the plurality of second display units respectively have a first side extending in the second direction and a second side extending in the first direction; in an unbent state of each of the second display areas, a first pitch, which is a distance between first sides of two of the first display units adjacent each other in the first direction, is greater than a second pitch, which is a distance between first sides of two of the second display units adjacent each other in the first direction, and a third pitch, which is a distance between second sides of two of the first display units adjacent each other in the second direction, is substantially the same as a fourth pitch, which is a distance between second sides of two of the second display units adjacent each other in the second direction; and in a bent state of each of the second display areas, the first pitch is substantially the same as the second pitch, and the third pitch is substantially the same as the fourth pitch.

9. The display device of claim 8, wherein a corner of the first display area has a rounded shape.

* * * * *